United States Patent
Usami et al.

(10) Patent No.: US 11,169,451 B2
(45) Date of Patent: Nov. 9, 2021

(54) IMAGE EXPOSURE DEVICE AND IMAGE EXPOSURE METHOD

(71) Applicant: FUJIFILM Corporation, Tokyo (JP)

(72) Inventors: Yoshihisa Usami, Kanagawa (JP);
Shinichiro Sonoda, Kanagawa (JP);
Hirotoshi Yoshizawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 79 days.

(21) Appl. No.: 16/846,431

(22) Filed: Apr. 13, 2020

(65) Prior Publication Data

US 2020/0241432 A1 Jul. 30, 2020

Related U.S. Application Data

(63) Continuation of application No. PCT/JP2018/037293, filed on Oct. 5, 2018.

(30) Foreign Application Priority Data

Nov. 7, 2017 (JP) .............................. JP2017-214562

(51) Int. Cl.
*G03F 7/20* (2006.01)
*G02B 5/28* (2006.01)
(Continued)

(52) U.S. Cl.
CPC ........... *G03F 7/70991* (2013.01); *G02B 5/28* (2013.01); *G03B 17/52* (2013.01); *G03B 27/32* (2013.01); *G03B 27/522* (2013.01); *G03F 7/004* (2013.01)

(58) Field of Classification Search
CPC ....... G03F 7/70991; G02B 5/28; G03B 17/52; G03B 27/522; G03B 17/48; G03B 17/50; B41F 17/00
See application file for complete search history.

(56) References Cited

U.S. PATENT DOCUMENTS 9,126,396 B2    9/2015  Degani et al.
10,969,696 B2 *  4/2021  Usami ................ H04N 1/00275
(Continued)

FOREIGN PATENT DOCUMENTS

JP    H0547624    2/1993
JP    H0743528    2/1995
(Continued)

OTHER PUBLICATIONS

"International Search Report (Form PCT/ISA/210) of PCT/JP2018/037293," dated Dec. 4, 2018, with English translation thereof, pp. 1-5.
(Continued)

*Primary Examiner* — Christopher E Mahoney
(74) *Attorney, Agent, or Firm* — JCIPRNET

(57) ABSTRACT

An image exposure device includes an image display device having pixels that emit light having a plurality of wavelengths; a photosensitive recording medium support portion that supports a photosensitive recording medium for recording an image of the image display device; a collimation portion that is disposed between the image display device and the photosensitive recording medium support portion and makes radiation light including the light having a plurality of wavelengths radiated from the pixels into first transmitted light radiated within a range of a first radiation angle narrower than a radiation angle of the radiation light; and a dichroic filter that is disposed between the collimation portion and the photosensitive recording medium support portion, and makes the first transmitted light including the light having a plurality of wavelengths into second transmitted light radiated within a range of a second radiation angle equal to or smaller than the first radiation angle.

20 Claims, 12 Drawing Sheets

(51) Int. Cl.
  *G03F 7/004* (2006.01)
  *G03B 17/52* (2021.01)
  *G03B 27/52* (2006.01)
  *G03B 27/32* (2006.01)

(56) References Cited

U.S. PATENT DOCUMENTS

| | | | | |
|---|---|---|---|---|
| 2003/0128399 | A1* | 7/2003 | Chino | B41J 2/445 358/296 |
| 2009/0168035 | A1* | 7/2009 | Kim | G03F 7/70391 355/53 |
| 2009/0294634 | A1 | 12/2009 | Kurahashi et al. | |
| 2012/0140194 | A1* | 6/2012 | Bae | G03F 7/70391 355/55 |
| 2013/0182234 | A1 | 7/2013 | Graupner et al. | |

FOREIGN PATENT DOCUMENTS

| | | | |
|---|---|---|---|
| JP | 2009290414 | 12/2009 | |
| JP | 2010097128 | 4/2010 | |
| JP | 2013540349 | 10/2013 | |
| JP | 5391641 | 1/2014 | |
| JP | 2015045821 | 3/2015 | |
| WO | WO-2007057819 A1 * | 5/2007 | ......... G02B 19/0028 |
| WO | 2012041341 | 4/2012 | |
| WO | WO-2019059176 A1 * | 3/2019 | ............. G03B 27/04 |

OTHER PUBLICATIONS

"Written Opinion of the International Searching Authority (Form PCT/ISA/237) of PCT/JP2018/037293," dated Dec. 4, 2018, with English translation thereof, pp. 1-12.

"Office Action of Japan Counterpart Application", dated Feb. 24, 2021, with English translation thereof, pp. 1-5.

Office Action of China Counterpart Application, with English translation thereof, dated Mar. 3, 2021, pp. 1-10.

* cited by examiner

IMAGE EXPOSURE DEVICE AND IMAGE EXPOSURE METHOD

CROSS-REFERENCE TO RELATED APPLICATIONS

This application is a Continuation of PCT International Application No. PCT/JP2018/037293 filed on Oct. 5, 2018, which claims priority under 35 U.S.C § 119(a) to Japanese Patent Application No. 2017-214562 filed on Nov. 7, 2017. Each of the above applications is hereby expressly incorporated by reference, in its entirety, into the present application.

BACKGROUND OF THE INVENTION

1. Field of the Invention

The present invention relates to an image exposure device and an image exposure method and relates to an image exposure device and an image exposure method for recording an image in a photosensitive recording medium.

2. Description of the Related Art

In recent years, a variety of studies regarding a device for exposing a display image of an image display device such as a light-emitting display screen to a photosensitive recording medium such as an instant film have been underway.

For example, U.S. Pat. No. 9,126,396B discloses a device in which a collimation layer is disposed between a light-emitting display screen and an instant film. In U.S. Pat. No. 9,126,396B, the collimation layer blocks unparallel light from the light-emitting display screen, and thus it is possible to remove the necessity for a lens or the like in the device.

JP1995-043528 (JP-H07-043528) discloses that a photosensitive material is exposed to light with a specific wavelength transmitted through a filter device in which two filters having different peak shift amounts are stacked. According to JP1995-043528 (JP-H07-043528), it is possible to expose a photosensitive material with good reproducibility by preventing colors from being mixed or the like.

SUMMARY OF THE INVENTION

However, depending on an aspect ratio h/d (h:tunnel height, d:diameter of the tunnel) of a collimation layer, an instant film is irradiated with light having a radiation angle with a certain spread, and thus there is a concern that image bleeding may occur and that image quality may degrade. In addition, even in a case where a diameter of a tunnel is smaller than a pixel pitch, in a case where the tunnel is located between the pixel pitches, light that causes blurring of an image cannot be blocked in some cases, and there is a concern that image quality may degrade. In addition, in a case where the collimation layer is a fiber array in which a plurality of optical fibers are bundled, a numerical aperture is approximately 0.43, and a light receiving angle increases to ±25°.

In the collimation layer, moire may occur in some cases in a relationship between the pixel pitch of the light-emitting display screen and the tunnel pitch of the collimation layer.

In the filter device disclosed in JP1995-043528 (JP-H07-043528), since light having an incident angle exceeding 30° is transmitted, leakage light occurs and there is a concern that image bleeding may occur and that image quality may degrade. In addition, this filter device is applied to transmitting light with a certain wavelength, and there is no disclosure that light having a plurality of wavelengths is transmitted.

The present invention has been made in consideration of the above-described circumstance, and an object of the present invention is to provide an image exposure device and an image exposure method capable of suppressing the degradation of image quality and occurrence of the moire and performing exposure to light having a plurality of wavelengths.

In order to attain the object of the present invention, a first form of an image exposure device comprises an image display device having pixels that emit light having a plurality of wavelengths; a photosensitive recording medium support portion that supports a photosensitive recording medium for recording an image of the image display device in a state in which an exposure surface of the photosensitive recording medium faces the image display device; a collimation portion that is disposed between the image display device and the photosensitive recording medium support portion and makes radiation light including the light having a plurality of wavelengths radiated from the pixels into first transmitted light radiated within a range of a first radiation angle narrower than a radiation angle of the radiation light; and a dichroic filter that is disposed between the collimation portion and the photosensitive recording medium support portion, and makes the first transmitted light including the light having a plurality of wavelengths into second transmitted light radiated within a range of a second radiation angle equal to or smaller than the first radiation angle.

In a second form of the image exposure device, the dichroic filter is formed by a multilayer film in which a plurality of high refractive index layers having a refractive index of $n_1$ and a plurality of low refractive index layers having a refractive index of $n_2$ are alternately laminated, an optical film thickness of the high refractive index layer is an integral multiple of $\lambda/4$, and an optical film thickness of the low refractive index layer is an integral multiple of $\lambda/4$.

In a third form of the image exposure device, the multilayer film includes two or more layers of any of a thick high refractive index layer having an optical film thickness at least 4 times as large as $\lambda/4$ or a thick low refractive index layer having an optical film thickness at least 4 times as large as $\lambda/4$.

In a fourth form of the image exposure device, two layers of any of the thick high refractive index layer or the thick low refractive index layer have different ratios of the optical film thickness with respect to $\lambda/4$.

In a fifth form of the image exposure device, the collimation portion includes at least one selected from a louver, a fiber optic plate, or a capillary plate.

In a sixth form of the image exposure device, the image display device has two-dimensionally arrayed pixels and the image exposure device exposes an entire two-dimensional region of the exposure surface of the photosensitive recording medium at the same time.

In a seventh form of the image exposure device, the image display device has one-dimensionally arrayed pixels, and the image exposure device further comprises a scanning portion that scans at least any one of the image display device or the photosensitive recording medium supported by the photosensitive recording medium support portion, along a direction perpendicular to an array direction of the pixels of the image display device.

In an eighth form of the image exposure device, the image display device has two-dimensionally arrayed pixels on a region having a smaller area than the exposure surface of the photosensitive recording medium, and the image exposure device further comprises a scanning portion that scans at least any one of the image display device or the photosensitive recording medium supported by the photosensitive recording medium support portion along both an array direction of the pixels of the image display device and a direction perpendicular to the array direction of the pixels.

In a ninth form of the image exposure device, among exposure ranges to light radiated from the pixels, adjacent exposure ranges partially overlap each other.

In a tenth form of the image exposure device, the image display device is attachable and detachable. The fact that the image display device is attachable and detachable means that the image display device can be attached and detached.

In an eleventh form of the image exposure device, the photosensitive recording medium support portion supports the photosensitive recording medium attachably and detachably.

A twelfth form of an image exposure method comprises a step of preparing an image display device having pixels that emit light having a plurality of wavelengths; a step of preparing a photosensitive recording medium support portion that supports a photosensitive recording medium for recording an image of the image display device in a state in which an exposure surface of the photosensitive recording medium faces the image display device; and a step of exposing the exposure surface of the photosensitive recording medium to second transmitted light, through a collimation portion that is disposed between the image display device and the photosensitive recording medium support portion and makes radiation light including the light having a plurality of wavelengths radiated from the pixels into first transmitted light radiated within a range of a first radiation angle narrower than a radiation angle of the radiation light, and a dichroic filter that is disposed between the collimation portion and the photosensitive recording medium support portion and makes the first transmitted light including the light having a plurality of wavelengths into the second transmitted light radiated within a range of a second radiation angle equal to or smaller than the first radiation angle.

According to the present invention, it is possible to suppress degradation of image quality and occurrence of moire and perform exposure to light having a plurality of wavelengths.

DESCRIPTION OF THE PREFERRED EMBODIMENTS

Hereinafter, preferred embodiments of the present invention will be described according to the accompanying drawings. The present invention will be described using preferred embodiments below. The embodiments can be modified using a number of methods within the scope of the present invention, and embodiments other than the embodiments can be used. Therefore, all modifications within the scope of the present invention are included in the scope of claims.

Figure 1:
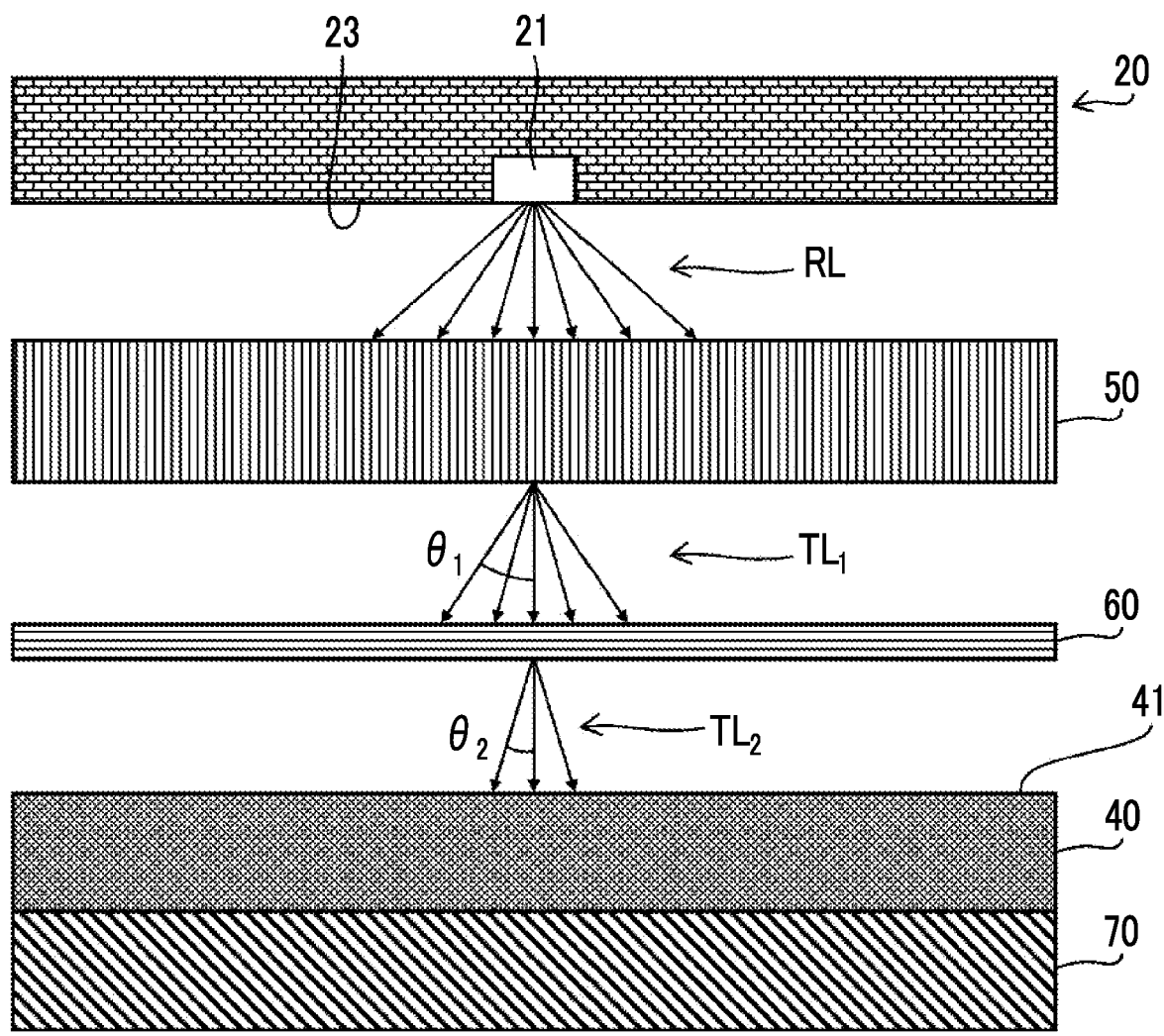
FIG. 1 is a view for describing a principle of the present invention.

A principle of the present invention will be described with reference to FIG. 1. As shown in FIG. 1, an image exposure device 10 includes an image display device 20 and a photosensitive recording medium support portion 70 that supports a photosensitive recording medium 40. The photosensitive recording medium support portion 70 may directly or indirectly support the photosensitive recording medium 40.

The image display device 20 includes a pixel 21. Radiation light RL, including light having a plurality of wavelengths, from the pixel 21 is emitted from an image display surface 23 of the image display device 20. The pixel 21 refers to a minimum unit of color information configuring the image display surface 23. The image display device 20 has the pixel 21 and is thus capable of displaying an image.

The image display device 20 preferably includes a plurality of the pixels 21 in order to display an image. As the image display device 20 having the pixels 21, a liquid crystal display (LCD) device, an organic light emitting diode (OLED) display device, a plasma display device, a light emitting diode (LED) display device, a cathode ray tube (CRT) display device, or the like can be applied.

The image display device 20 is not limited to the above-described structure as long as the pixels 21 are capable of displaying any color information and capable of displaying an image.

Here, the pixel 21 refers, for example, not only to the pixel 21 through which light from a backlight unit is radiated as in a liquid crystal display device but also to the pixel 21 that radiates light on its own as in an organic light emitting diode display device.

The image display surface 23 of the image display device 20 may have the pixels 21 that are two-dimensionally arrayed or the pixels 21 that are one-dimensionally arrayed. In addition, the two-dimensional image display surface 23 may have a rectangular shape or a non-rectangular shape in a plan view.

The photosensitive recording medium support portion 70 supports the photosensitive recording medium 40 so that the photosensitive recording medium 40 is disposed at a location facing the image display surface 23 of the image display device 20. The structure of the photosensitive recording medium support portion 70 is not particularly limited as long as the photosensitive recording medium support portion is capable of supporting the photosensitive recording medium 40.

The photosensitive recording medium 40 is not particularly limited as long as the photosensitive recording medium is capable of performing exposure to light and capable of forming an image.

The photosensitive recording medium 40 is configured with, for example, a support and a photosensitive material provided on the support. The photosensitive recording medium 40 has an exposure surface 41 exposed to light. The photosensitive recording medium 40 is not particularly limited, as long as the photosensitive recording medium is a photosensitive product such as a photograph film, a dry plate, photographic printing paper or blueprint, positive paper, a wet plate for platemaking, a photoresist, or an instant film. An instant film is preferably applied.

As shown in FIG. 1, the image exposure device 10 includes a collimation portion 50 disposed between the image display device 20 and the photosensitive recording medium support portion 70, and a dichroic filter 60 disposed between the collimation portion 50 and the photosensitive recording medium support portion 70.

The collimation portion 50 transmits radiation light RL including light having a plurality of wavelengths, radiated from the pixels 21 and thus makes the radiation light RL into first transmitted light $TL_1$ radiated within a range of a first radiation angle $\theta_1$ narrower than a radiation angle of the radiation light RL. Here, the radiation angle refers to an angle of light spread with respect to an optical axis of light.

In a case where the light from the adjacent pixel 21 reaches the exposure surface 41 of the photosensitive recording medium 40, degradation of image quality occurs. The collimation portion 50 allows only light corresponding to the pixel 21 to reach the exposure surface 41 and restricts the light from the adjacent pixel 21 from reaching the exposure surface 41. Since the image exposure device 10 includes the collimation portion 50, the image exposure device 10 does not need to include an optical system such as a lens for forming an image of light from the image exposure device 10 on the photosensitive recording medium 40. The collimation portion 50 preferably has a thickness of 1 mm or more and 5 mm or less.

As the collimation portion 50, for example, at least one selected from a louver, a fiber optic plate, or a capillary plate can be applied.

The louver is configured with a plurality of light transmission parts and a light absorption body that is disposed between the plurality of light transmission parts and prevents light from reaching an adjacent space. The light transmission parts are, for example, rectangular and are two-dimensionally arrayed at a constant pitch. The pitch refers to a distance between adjacent light transmission parts.

For example, the light transmission parts can be formed by two louvers. A rectangular light transmitting portion can be formed by stacking two louvers in which the light transmission parts extending in one direction and the light absorption body are alternately disposed, and setting an angle formed by the upper and lower light transmission parts to, for example, 90°. The angle formed by the upper and lower light transmission part is not limited to 90° and can be determined as appropriate.

The fiber optic plate is a plate including a plurality of two-dimensionally arrayed optical fibers for transferring light at a constant pitch and a glass absorber that absorbs light leaking from the optical fibers.

The capillary plate is a plate formed of an aggregate of a plurality of capillaries, which are two-dimensionally arrayed at a constant pitch and have a hole of several tens of micrometers or less.

In an embodiment, the collimation portion 50 has a physical structure in which a light transmitting part (such as light transmission part or capillary) is surrounded by a light shielding part (such as light absorption body, absorption body glass, or outer wall of capillary) having a function of light reflection and/or light absorption, in order to restrict the radiation angle of light from the pixels 21, as in the louver, the fiber optic plate, the capillary plate, or the like.

Therefore, even in a case where the radiation light RL is restricted to be in a range narrower than the first radiation angle $\theta_1$, there is a concern that the moire called interference fringes due to the relationship between the pitch of the pixels 21 and the pitch of the collimation portions 50 may occur in the first transmitted light $TL_1$. In a case where the exposure surface 41 of the photosensitive recording medium 40 is directly exposed to the first transmitted light $TL_1$ in which the moire occurred, image quality may degrade in some cases.

Depending on the relationship of an aspect ratio h/d (h:height of transmission unit, d:diameter of transmission unit) of the light transmitting part configuring the collimation portion 50, the first radiation angle $\theta_1$ cannot not be restricted to a desired angle or less in some cases. The diameter d of the transmitting part of the collimation portion 50 depends on processing accuracy. The height h of the transmitting part (thickness of the collimation portion 50) depends on an overall size of the image exposure device 10. The diameter d of the transmitting part and the height h of the transmitting part cannot be set to desired sizes, in some cases.

In addition, in a case where the collimation portion 50 is an optical fiber array, a numerical aperture NA is approximately 0.43. The numerical aperture NA and a light receiving angle $\theta$ of the optical fiber array have a relationship of NA=n×sin $\theta$ (n: refractive index). In a case where the refractive index n of air is 1, 0.43=sin $\theta$. Noted that $\theta$=asin (0.43)=±25°. The light receiving angle $\theta$ refers to an angle of one fiber with respect to an optical axis. Even in a case where the radiation light RL is transmitted through the collimation portion 50 and restricted to be the first transmitted light $TL_1$ at the first radiation angle $\theta_1$, light from the pixels 21 adjacent to reaches the photosensitive recording medium 40. As a result, the image quality may degrade in some cases.

In order to restrict the radiation angle, it is desirable that the collimation portion 50 is in close contact with the image display device 20 and the photosensitive recording medium 40. However, due to the structure of the image exposure device 10, it is difficult to achieve perfect contact.

As described above, there is a concern that merely disposing the collimation portion 50 between the image display device 20 and the photosensitive recording medium support portion 70 cannot sufficiently restrict the radiation angle of the radiation light RL from the pixels 21.

In order to respond to the above-described concern, the image exposure device 10 of the embodiment includes the dichroic filter 60, that transmits light having a plurality of wavelengths, between the collimation portion 50 and the photosensitive recording medium support portion 70 that supports the photosensitive recording medium 40.

The dichroic filter 60 has a function of restricting the radiation angle of light, as the collimation portion 50. As shown in FIG. 1, the dichroic filter 60 makes the first transmitted light $TL_1$ into second transmitted light $TL_2$ radiated within a range of a second radiation angle $\theta_2$ equal to or smaller than the first radiation angle $\theta_1$. The dichroic filter 60 of the embodiment is different from the collimation portion 50 in that the dichroic filter 60 does not have a physical structure such as the above-described light transmitting part and light shielding part for restricting the light radiation angle of light.

The dichroic filter 60 makes the first transmitted light $TL_1$ restricted by the collimation portion 50 into the second transmitted light $TL_2$ radiated within the further restricted range of the second radiation angle $\theta_2$. Therefore, it is possible to prevent the first transmitted light $TL_1$ overlapping between the adjacent pixels 21 from reaching the exposure surface 41, and to prevent the image quality from degrading. In particular, in a case where the collimation portion 50 is an optical fiber plate and the light receiving angle $\theta$ is greater than 25°, disposing the dichroic filter 60 is advantageous for preventing the image quality from degrading. Therefore, it is important that the image exposure device 10 includes the image display device 20, the collimation portion 50, the dichroic filter 60, and the photosensitive recording medium support portion 70 that supports the photosensitive recording medium 40 in this order. The light receiving angle $\theta$ refers to an angle formed by a normal to an incident surface of the collimation portion 50 and a direction of light incidence in a case where light is incident on the collimation portion 50, and an angle at which an inside of the collimation portion 50 totally reflects light.

In addition, since the dichroic filter 60 has a smaller thickness than that of the collimation portion 50, the dichroic filter 60 is less likely to be limited by the structure of the image exposure device 10.

The dichroic filter 60 does not have a physical structure, and makes the light into the second transmitted light $TL_2$ radiated within the range of the first radiation angle $\theta_1$ and preferably within the range of the narrow second radiation angle $\theta_2$, and is thus capable of eliminating the moire. The moire can be eliminated by making the pitch of the collimation portion 50 larger than the pitch of the pixels 21. Even in a case where the pitch of the collimation portion 50 is increased, the dichroic filter 60 is capable of preventing the first transmitted light $TL_1$ overlapping between the adjacent pixels 21 from reaching the exposure surface 41.

Light beam is incident, and the radiation angle is measured from an angle distribution of transmitted light. A half angle of peak light in an angle profile is defined as the radiation angle. An angle is measured on both a long wave side and a short wave side, and width of the angle is defined as the radiation angle. For example, the radiation angle can be measured using a spectrophotometric type variable angle color difference meter GC 5000 (manufactured by NIPPON DENSHOKU INDUSTRIES Co., LTD).

Next, a preferred embodiment of the dichroic filter 60 will be described. Examples of the dichroic filter 60 can include a dichroic filter of multilayer film configured with a plurality of dielectric layers.

The dichroic filter 60 is formed by a multilayer film in which a plurality of high refractive index layers formed of a dielectric material having a refractive index of $n_1$ and a plurality of low refractive index layers formed of a dielectric material having a refractive index of $n_2$ are alternately laminated.

Examples of the dielectric materials applied to the high refractive index layer and the low refractive index layer can include the following. Since the refractive index varies depending on the wavelength, it is preferable to select a material as appropriate, according to the wavelength of targeted light.

For a visible light region, examples of the material for the high refractive index layer having a refractive index $n_1$ of approximately 1.6 or more can include $TiO_2$, $CeO_2$, $Ta_2O_5$, $ZrO_2$, $Sb_2O_3$, $HfO_2$, $La_2O_3$, $NdO_3$, $Y_2O_3$, $ZnO$, $Nb_2O_5$, $MgO$, $Al_2O_3$, $CeF_3$, $LaF_3$, and $NdF_3$.

In addition, for the visible light region, examples of the material for the low refractive index layer having a refractive index $n_2$ of approximately 1.5 or less can include $SiO_2$, $AlF_3$, $MgF_2$, $Na_3AlF_6$, $NaF$, $LiF$, $CaF_2$, and $BaF_2$.

In the dichroic filter 60, it is known that, at a specific wavelength, a spectrum peak of light having a large incident angle shifts to a shorter wavelength, compared to light having a small incident angle.

By using this characteristic, the dichroic filter 60 can be configured to include two narrowband dichroic filters whose peak wavelengths of spectrum incident and transmitted at a specific angle at a specific wavelength are equal to each other, and peak shift amounts of the spectrum incident and transmitted at an angle different from the specific angle from each other.

This peak shift amount can be determined by a layer structure of the dichroic filter 60. That is, the number and thickness of the high refractive index layer and the low refractive index layer of the dichroic filter 60 can be determined such that light within the range of the second radiation angle $\theta_2$ is transmitted from the first transmitted light $TL_1$ without transmitting light over the range of the second transmitted light $TL_2$, to make the second transmitted light $TL_2$.

The number and thickness of the high refractive index layer and the low refractive index layer can be calculated, for example, by a known method (see "Optical Thin Film" by H. A. Macleod, published by Nikkan Kogyo Shimbun, 1989, pp. 47-51).

In order to perform the calculation, a computer program can be used, for example, software TFCalc (Thin Film Calculations) manufactured by Software Spectra, Inc. (USA) can be used. When the computer program is used, a target wavelength $\lambda$, that is a peak wavelength of a transmission spectrum is set. Next, based on the target wavelength $\lambda$, a multilayer film having a plurality of high refractive index layers and a plurality of low refractive index layers that cause interference due to refraction to occur is designed.

A physical thickness of the high refractive index layer designed in this manner is a value of an integral multiple of $(\lambda/4) \times n_1$ of the target wavelength, and an optical film thickness of the high refractive index layer is a value of an integral multiple of $\lambda/4$ of the target wavelength. Similarly, the physical thickness of the low refractive index layer is a value of an integral multiple of $(\lambda/4) \times n_2$ of the target wavelength, and the optical film thickness of the low refractive index layer is a value of integral multiple of $\lambda/4$ of the target wavelength. The optical film thickness is a value obtained by multiplying the physical thickness of each layer by the refractive index of the layer. In the present specification, the integral multiple includes not only a case of a perfect integral multiple but also a substantially integral multiple. The substantially integral multiple means that a difference with respect to integral multiple is included within an allowable range based on the calculation, and ±10% of integral multiple is allowable.

The design of the multilayer film is suitable for use as a narrowband dichroic filter that transmits light at a specific wavelength and near the specific wavelength. However, radiation light RL radiated from the pixels 21 of the image display device 20 includes light having a plurality of wavelengths. Therefore, the dichroic filter 60 is required to transmit not only the light at a specific wavelength but also light having a plurality of wavelengths and restrict the radiation angle. The dichroic filter 60 of the embodiment is designed as the multilayer film capable of transmitting light having a plurality of wavelengths.

Tables 1 to 3 show structures of typical multilayer films of the dichroic filter 60 capable of transmitting light having a plurality of wavelengths. Each structure has 24 layers. $n_1$ and $n_2$ shown in the column of "Kind" indicate the high refractive index layer and the low refractive index layer, respectively. The optical film thickness/($\lambda$/4) indicates a ratio of the optical film thickness with respect to $\lambda$/4. That is, the optical film thickness/($\lambda$/4) indicates how many times the optical film thickness of each layer is ($\lambda$/4).

The multilayer film shown in Table 1 has 12 high refractive index layers and 12 low refractive index layers. The optical film thicknesses of the high refractive index layers are 1 time as large as ($\lambda$/4) except for a seventh layer. The optical film thickness of the seventh layer is 6 times as large as ($\lambda$/4). The optical film thicknesses of the low refractive index layers are 1 time as large as ($\lambda$/4) except for an eighteenth layer. The optical film thickness of the eighteenth layer is 8 times as large as ($\lambda$/4).

TABLE 1

| No | Kind | Optical film thickness/($\lambda$/4) |
|---|---|---|
| 1 | $n_1$ | 1 |
| 2 | $n_2$ | 1 |
| 3 | $n_1$ | 1 |
| 4 | $n_2$ | 1 |
| 5 | $n_1$ | 1 |
| 6 | $n_2$ | 1 |
| 7 | $n_1$ | 6 |
| 8 | $n_2$ | 1 |
| 9 | $n_1$ | 1 |
| 10 | $n_2$ | 1 |
| 11 | $n_1$ | 1 |
| 12 | $n_2$ | 1 |
| 13 | $n_1$ | 1 |
| 14 | $n_2$ | 1 |
| 15 | $n_1$ | 1 |
| 16 | $n_2$ | 1 |
| 17 | $n_1$ | 1 |
| 18 | $n_2$ | 8 |
| 19 | $n_1$ | 1 |
| 20 | $n_2$ | 1 |
| 21 | $n_1$ | 1 |
| 22 | $n_2$ | 1 |
| 23 | $n_1$ | 1 |
| 24 | $n_2$ | 1 |

The multilayer film shown in Table 2 has 12 high refractive index layers and 12 low refractive index layers. The optical film thicknesses of all the high refractive index layers are 1 time as large as ($\lambda$/4). The optical film thicknesses of the low refractive index layers are 1 time as large as ($\lambda$/4) except for an sixth layer and an eighteenth layer. The optical film thickness of the sixth layer is 6 times as large as ($\lambda$/4), and the optical film thickness of the eighteenth layer is 8 times as large as ($\lambda$/4).

TABLE 2

| No | Kind | Optical film thickness/($\lambda$/4) |
|---|---|---|
| 1 | $n_1$ | 1 |
| 2 | $n_2$ | 1 |
| 3 | $n_1$ | 1 |
| 4 | $n_2$ | 1 |
| 5 | $n_1$ | 1 |
| 6 | $n_2$ | 1 |
| 7 | $n_1$ | 6 |
| 8 | $n_2$ | 1 |
| 9 | $n_1$ | 1 |
| 10 | $n_2$ | 1 |
| 11 | $n_1$ | 1 |
| 12 | $n_2$ | 1 |
| 13 | $n_1$ | 1 |
| 14 | $n_2$ | 1 |
| 15 | $n_1$ | 1 |
| 16 | $n_2$ | 1 |
| 17 | $n_1$ | 1 |
| 18 | $n_2$ | 8 |
| 19 | $n_1$ | 1 |
| 20 | $n_2$ | 1 |
| 21 | $n_1$ | 1 |
| 22 | $n_2$ | 1 |
| 23 | $n_1$ | 1 |
| 24 | $n_2$ | 1 |

The multilayer film shown in Table 3 has 12 high refractive index layers and 12 low refractive index layers. The optical film thicknesses of the high refractive index layers are 1 time as large as ($\lambda$/4) except for a seventh layer and a nineteenth layer. The optical film thickness of the seventh layer is 6 times as large as ($\lambda$/4), and the optical film thickness of the nineteenth layer is 8 times as large as ($\lambda$/4). The optical film thicknesses of all the low refractive index layers are 1 time as large as ($\lambda$/4).

TABLE 3

| No | Kind | Optical film thickness/($\lambda$/4) |
|---|---|---|
| 1 | $n_1$ | 1 |
| 2 | $n_2$ | 1 |
| 3 | $n_1$ | 1 |
| 4 | $n_2$ | 1 |
| 5 | $n_1$ | 1 |
| 6 | $n_2$ | 1 |
| 7 | $n_1$ | 6 |
| 8 | $n_2$ | 1 |
| 9 | $n_1$ | 1 |
| 10 | $n_2$ | 1 |
| 11 | $n_1$ | 1 |
| 12 | $n_2$ | 1 |
| 13 | $n_1$ | 1 |
| 14 | $n_2$ | 1 |
| 15 | $n_1$ | 1 |
| 16 | $n_2$ | 1 |
| 17 | $n_1$ | 1 |
| 18 | $n_2$ | 8 |
| 19 | $n_1$ | 1 |
| 20 | $n_2$ | 1 |
| 21 | $n_1$ | 1 |
| 22 | $n_2$ | 1 |
| 23 | $n_1$ | 1 |
| 24 | $n_2$ | 1 |

The values of the optical film thickness shown in Tables 1 to 3 are perfect integral multiples of ($\lambda$/4). The values may be not only a perfect integral multiple but also a substantially integral multiple.

The multilayer films shown in Tables 1 to 3 include two or more layers of any of a thick high refractive index layer having an optical film thickness at least 4 times as large as λ/4 or a thick low refractive index layer having an optical film thickness at least 4 times as large as λ/4.

In the multilayer film shown in Table 1, the seventh layer is the thick high refractive index layer (6 times), and the eighteenth layer is the thick low refractive index layer (8 times). The multilayer film includes two layers, one thick high refractive index layer and one thick low refractive index layer.

In the multilayer film shown in Table 2, the sixth layer is the thick low refractive index layer (6 times), and the eighteenth layer is the thick low refractive index layer (8 times). The multilayer film includes two thick low refractive index layers.

In the multilayer film shown in Table 3, the seventh layer is the thick high refractive index layer (6 times), and the nineteenth layer is the thick high refractive index layer (8 times). The multilayer film includes two thick high refractive index layers.

In addition, in the multilayer films shown in Tables 1 to 3, the two layers have different ratios of the optical film thickness with respect to λ/4. In the structures of Tables 1 to 3, the ratio of the two thick film layers (thick high refractive index layer and/or thick low refractive index layer) is different as 6:8.

The two thick film layers are disposed at about ¼ location and about ¾ location, based on the first layer of the multilayer film. In the multilayer film of Table 1, thick film layers are disposed at locations of 7/24 and 18/24, respectively. In the multilayer film of Table 2, thick film layers are disposed at locations of 6/24 and 18/24, respectively. In the multilayer film of Table 3, thick film layers are disposed at locations of 7/24 and 18/24, respectively.

By setting the multilayer film to have the above-described configuration, light having a plurality of wavelengths can be transmitted and the radiation angle of the light can be restricted.

The structure of the multilayer film using the above-described TFCalc and a graph of the transmittance with respect to the wavelength will be described. Table 4 shows a structure of a 54-layer multilayer film. The wavelength was set to 550 nm, $Nb_5O_2$ was applied as the high refractive index layer, and $SiO_2$ was applied as the low refractive index layer. Here, the thickness indicates the physical thickness. As shown in Table 4, a fourteenth layer corresponds to the thick low refractive index layer, and a forty-first layer corresponds to the thick high refractive index layer.

TABLE 4

| No | Material | Film thickness (nm) |
|---|---|---|
| 1 | $Nb_5O_2$ | 244.44 |
| 2 | $SiO_2$ | 321.53 |
| 3 | $Nb_5O_2$ | 195.16 |
| 4 | $SiO_2$ | 114.93 |
| 5 | $Nb_5O_2$ | 50.47 |
| 6 | $SiO_2$ | 142.68 |
| 7 | $Nb_5O_2$ | 110.63 |
| 8 | $SiO_2$ | 116.12 |
| 9 | $Nb_5O_2$ | 46.54 |
| 10 | $SiO_2$ | 115.72 |
| 11 | $Nb_5O_2$ | 45.8 |
| 12 | $SiO_2$ | 126.1 |
| 13 | $Nb_5O_2$ | 40.72 |
| 14 | $SiO_2$ | 1148.48 |
| 15 | $Nb_5O_2$ | 37.97 |
| 16 | $SiO_2$ | 129.16 |
| 17 | $Nb_5O_2$ | 44.66 |
| 18 | $SiO_2$ | 117.68 |
| 19 | $Nb_5O_2$ | 47 |
| 20 | $SiO_2$ | 123.59 |
| 21 | $Nb_5O_2$ | 42.6 |
| 22 | $SiO_2$ | 183.73 |
| 23 | $Nb_5O_2$ | 46.06 |
| 24 | $SiO_2$ | 112.51 |
| 25 | $Nb_5O_2$ | 51.69 |
| 26 | $SiO_2$ | 99.64 |
| 27 | $Nb_5O_2$ | 53.91 |
| 28 | $SiO_2$ | 92.32 |
| 29 | $Nb_5O_2$ | 57.52 |
| 30 | $SiO_2$ | 78.09 |
| 31 | $Nb_5O_2$ | 333.94 |
| 32 | $SiO_2$ | 80.43 |
| 33 | $Nb_5O_2$ | 228.46 |
| 34 | $SiO_2$ | 82.84 |
| 35 | $Nb_5O_2$ | 332.2 |
| 36 | $SiO_2$ | 70.74 |
| 37 | $Nb_5O_2$ | 64.3 |
| 38 | $SiO_2$ | 90.42 |
| 39 | $Nb_5O_2$ | 62.48 |
| 40 | $SiO_2$ | 87.11 |
| 41 | $Nb_5O_2$ | 606.73 |
| 42 | $SiO_2$ | 25.46 |
| 43 | $Nb_5O_2$ | 82.92 |
| 44 | $SiO_2$ | 85.78 |
| 45 | $Nb_5O_2$ | 65.72 |
| 46 | $SiO_2$ | 97.45 |
| 47 | $Nb_5O_2$ | 61.6 |
| 48 | $SiO_2$ | 99.51 |
| 49 | $Nb_5O_2$ | 239.03 |
| 50 | $SiO_2$ | 108.99 |
| 51 | $Nb_5O_2$ | 66.67 |
| 52 | $SiO_2$ | 57.68 |
| 53 | $Nb_5O_2$ | 315.28 |
| 54 | $SiO_2$ | 356.38 |

FIGS. 3 to 9 are graphs showing a relationship between an incident angle and a transmittance of the multilayer film shown in Table 4. The vertical axis indicates the transmittance (%), and the horizontal axis indicates the wavelength (nm).

Figure 3:
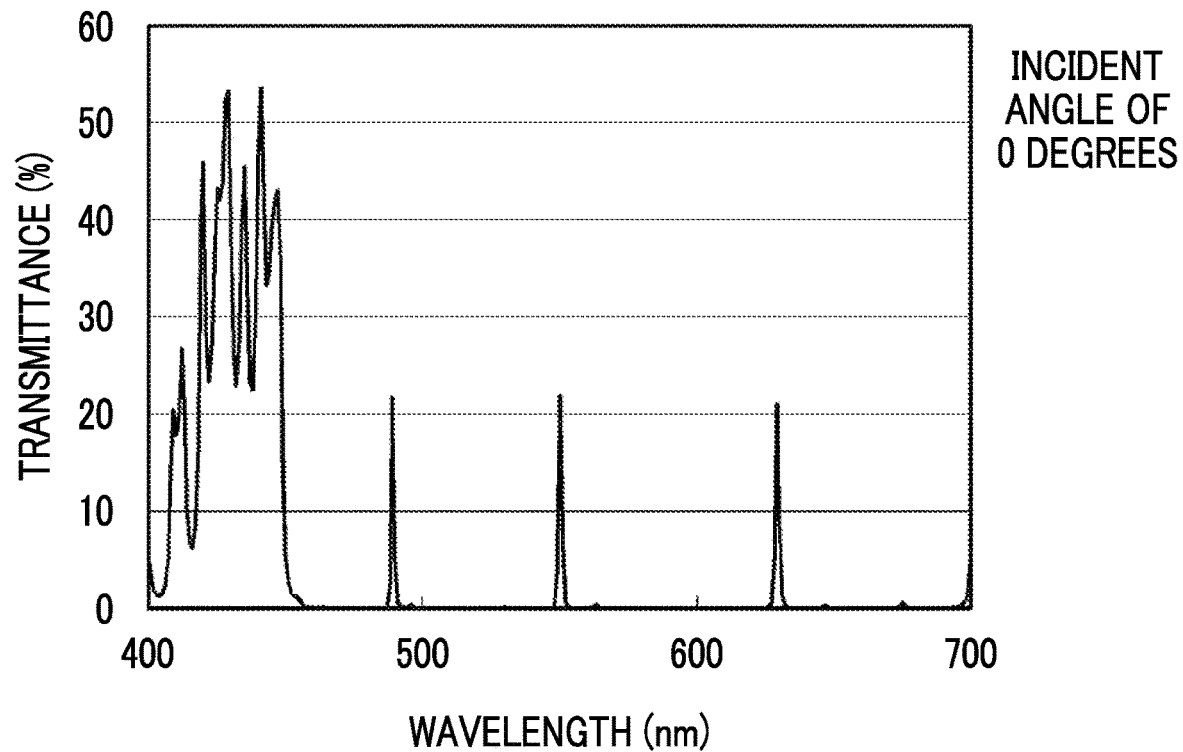
FIG. 3 is a graph showing a relationship between an incident angle and a transmittance in an embodiment.

FIG. 3 is a graph in a case where the incident angle is 0°. The incident angle refers to an angle between a normal to the incident surface of the dichroic filter and a direction of light incidence, in a case where the light is incident on the dichroic filter. FIG. 3 shows a case where light is perpendicularly incident on the dichroic filter.

As shown in FIG. 3, the graph shows a spectrum transmitted through the dichroic filter. Light transmitted through the dichroic filter has peaks at approximately 490 nm, approximately 550 nm, and approximately 630 nm, and each wavelength has a transmittance of 20% or higher. It can be understood that the dichroic filter transmits light having a plurality of wavelengths at the incident angle of 0°.

Figure 4:
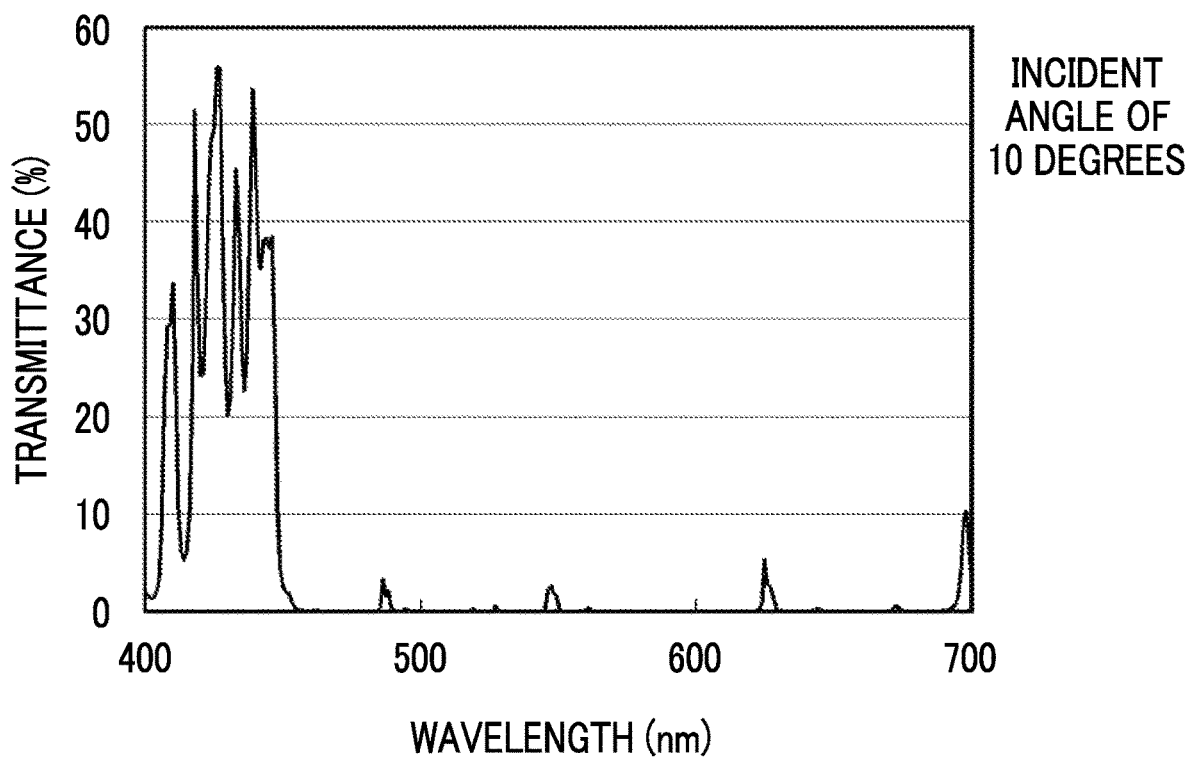
FIG. 4 is a graph showing a relationship between an incident angle and a transmittance in an embodiment.

FIG. 4 is a graph in a case where the incident angle is 10°. As shown in FIG. 4, the transmittance of light having peaks at approximately 490 nm, approximately 550 nm, and approximately 630 nm is 5% or lower.

Figure 5:
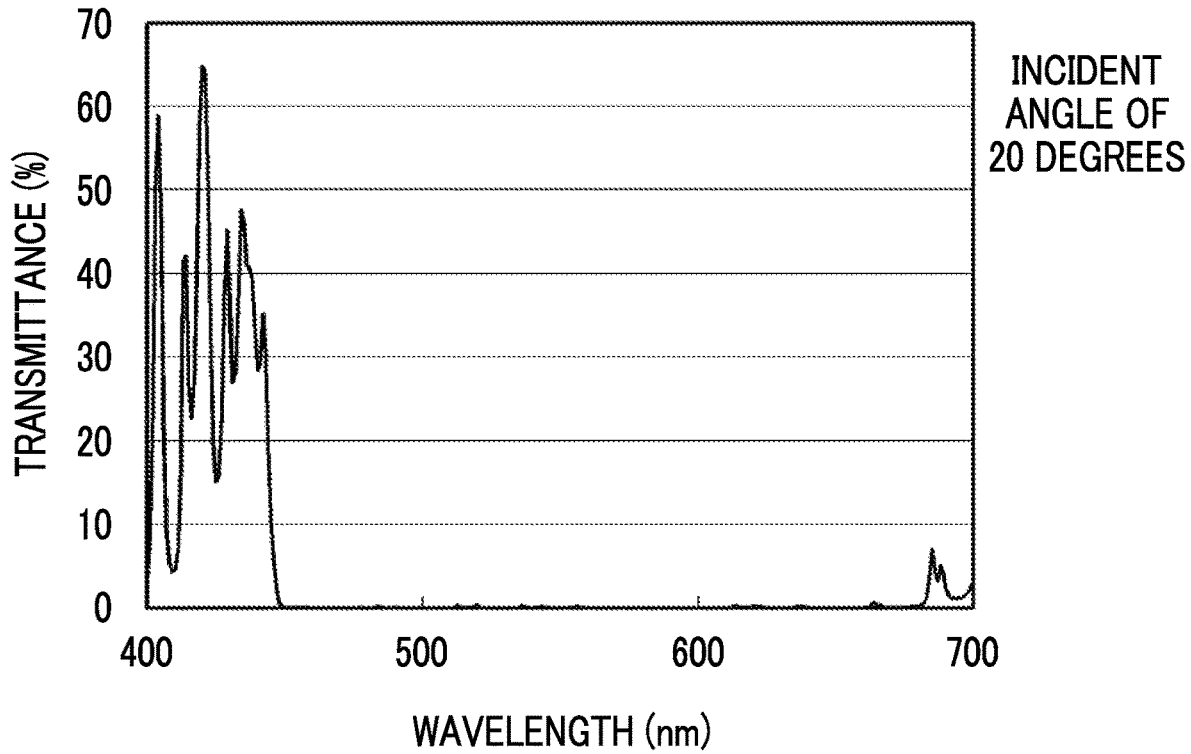
FIG. 5 is a graph showing a relationship between an incident angle and a transmittance in an embodiment.
Figure 6:
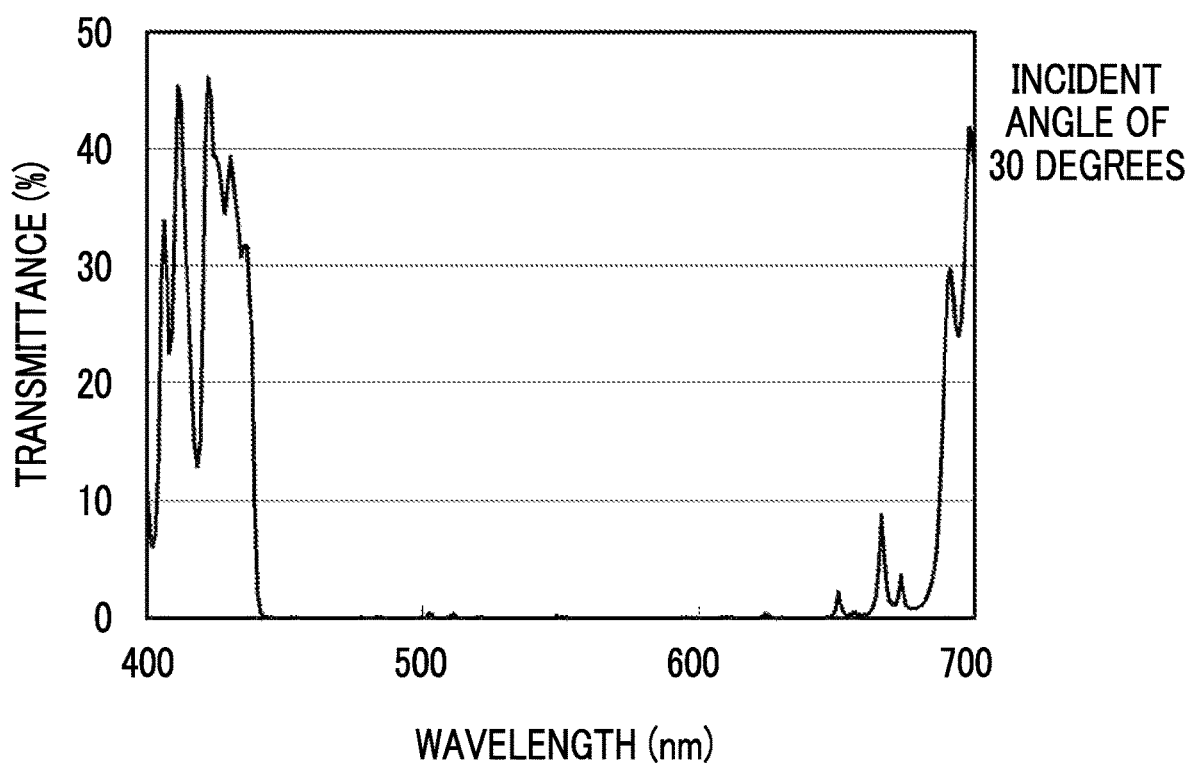
FIG. 6 is a graph showing a relationship between an incident angle and a transmittance in an embodiment.
Figure 7:
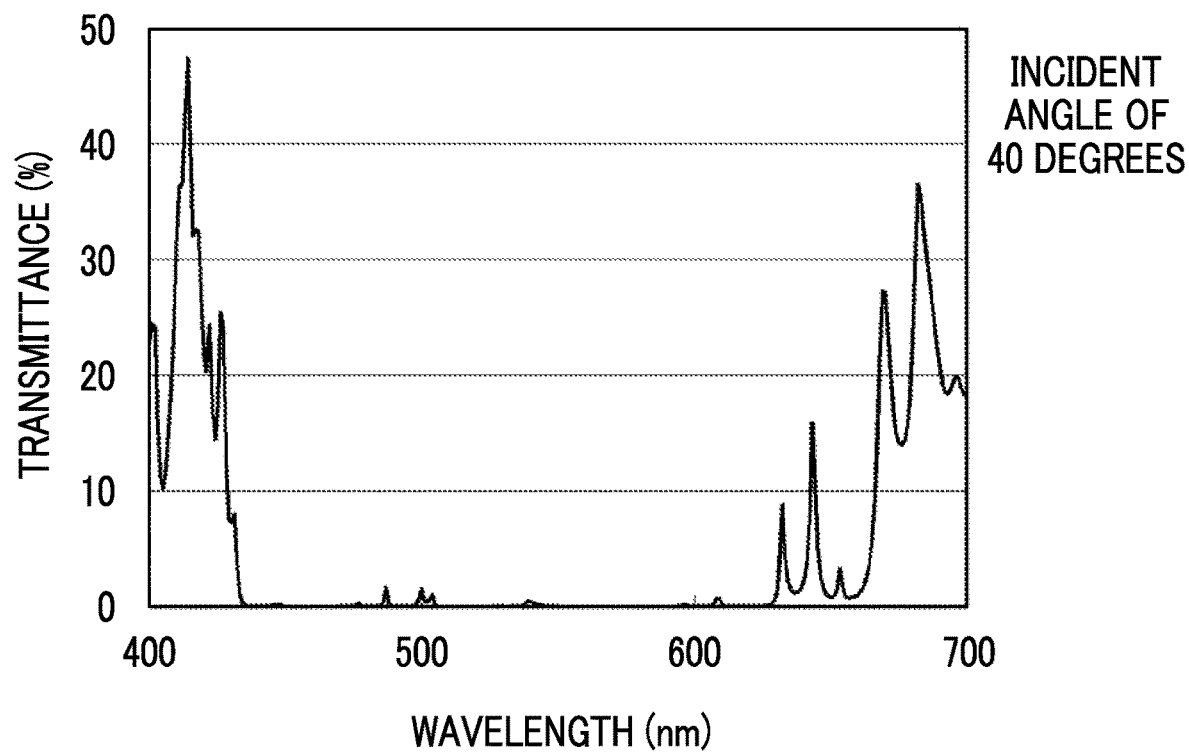
FIG. 7 is a graph showing a relationship between an incident angle and a transmittance in an embodiment.
Figure 8:
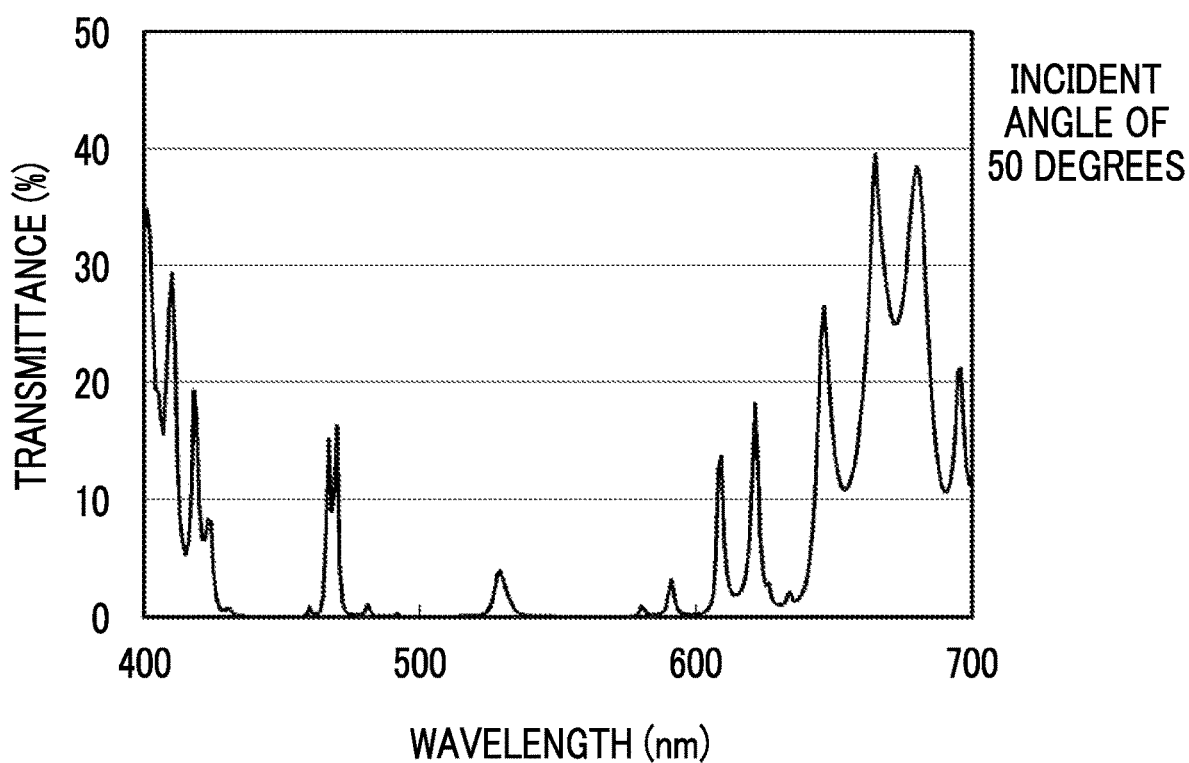
FIG. 8 is a graph showing a relationship between an incident angle and a transmittance in an embodiment.
Figure 9:
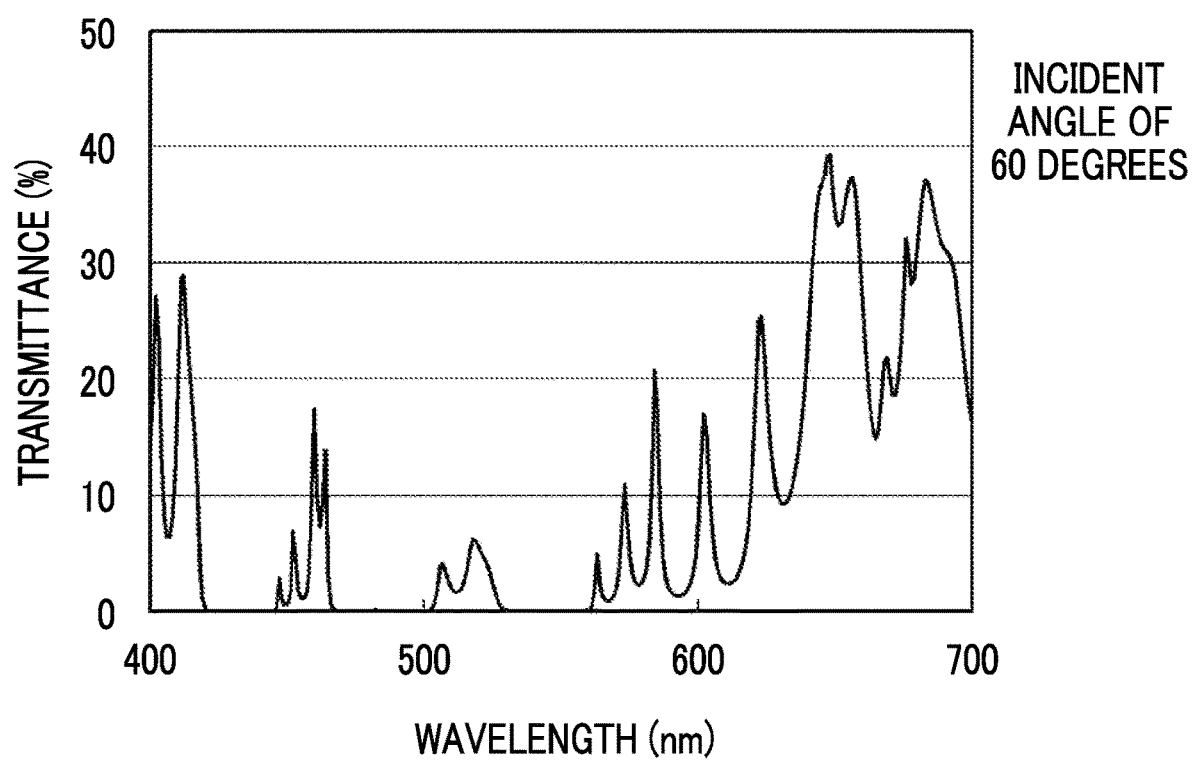
FIG. 9 is a graph showing a relationship between an incident angle and a transmittance in an embodiment.

FIG. 5 is a graph in a case where the incident angle is 20°.
FIG. 6 is a graph in a case where the incident angle is 30°.
FIG. 7 is a graph in a case where the incident angle is 40°.
FIG. 8 is a graph in a case where the incident angle is 50°.
FIG. 9 is a graph in a case where the incident angle is 60°.

As can be seen from FIGS. 5 and 6, it can be understood that the dichroic filter does not transmit light having peaks at approximately 490 nm, approximately 550 nm, and approximately 630 nm, in a case where the incident angle is more than 10° and 30° or smaller. It can be understood that light having peaks at approximately 490 nm, approximately 550 nm, and approximately 630 nm, transmitted through the dichroic filter having the multilayer film of the embodiment is restricted to have a radiation angle of 10° or smaller.

On the other hand, according to FIGS. 7 to 9, in a single dichroic filter, in a case where the incident angle is 40° or larger, the spectrum of light different from the light having peaks at approximately 490 nm, approximately 550 nm, and approximately 630 nm is shown in the graph. It is shown that these beams of light are transmitted through the dichroic filter. These beams of light are light transmitted through the dichroic filter unintentionally, and become so-called leaked light. In a case where the leaked light reaches the exposure surface, there is a concern that image quality may degrade.

In the embodiment, since the collimation portion 50 restricts the light having a radiation angle at which the incident angle is 30° or larger, the light leaked from the dichroic filter 60 can be suppressed. The leaked light can be prevented from reaching the exposure surface 41.

The graph in a case of the incident angle of 0° in FIG. 3 shows a spectrum having a peak on a short wavelength side. In a case where the photosensitive recording medium 40 is exposed, there is a concern that the influence may be exerted. Therefore, it is preferable to dispose an optical filter such that a spectrum having a peak on the short wavelength side is not transmitted through the dichroic filter 60. For example, an optical dichroic film or an optical filter using a light absorption material can be used. Examples of the optical dichroic film include a dichroic long-pass filter manufactured by Edmund Optics. Examples of the optical filter include a UV absorbing filter manufactured by Edmund Optics.

Figure 2:
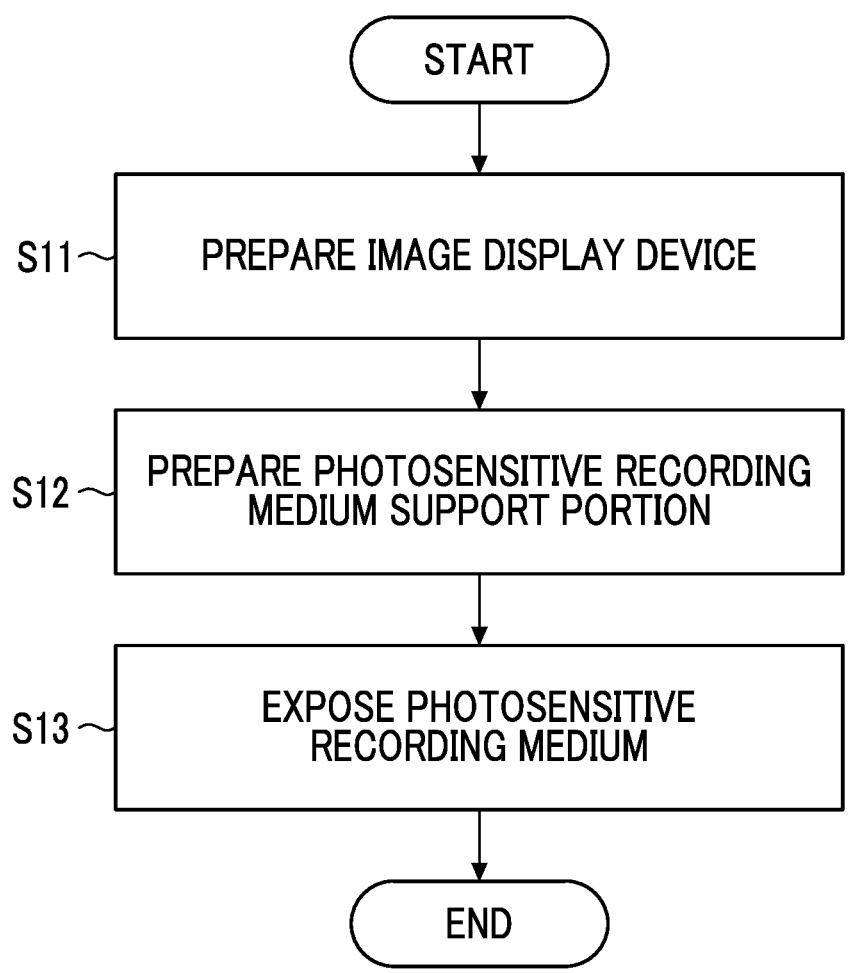
FIG. 2 is a flowchart showing an exposure method of the present invention.

Next, an image exposure method using the image exposure device 10 will be described. FIG. 2 is a flowchart showing an exposure method of the embodiment of the present invention. First, the image display device 20 is prepared (Step S11). Next, the photosensitive recording medium support portion 70 that supports the photosensitive recording medium 40 in which an image of the image display device 20 is recorded in a state in which the exposure surface 41 of the photosensitive recording medium 40 faces the image display device 20 is prepared (Step S12). Regarding the order of the preparation of the image display device 20 of Step S11 and the preparation of the photosensitive recording medium support portion 70 of Step S12, any preparation may come first.

Next, the exposure surface 41 of the photosensitive recording medium 40 is exposed to the light from the image display device 20 (Step S13). In Step S13, the exposure surface 41 of the photosensitive recording medium 40 is exposed to the second transmitted light $TL_2$, through the collimation portion 50 that is disposed between the image display device 20 and the photosensitive recording medium support portion 70 and makes radiation light RL including the light having a plurality of wavelengths radiated from the pixels 21 into the first transmitted light $TL_1$ radiated within a range of a first radiation angle $\theta_1$ narrower than the radiation angle of the radiation light RL, and the dichroic filter 60 that is disposed between the collimation portion 50 and the photosensitive recording medium support portion 70 and makes the first transmitted light $TL_1$ including the light having a plurality of wavelengths into the second transmitted light $TL_2$ radiated within a range of the second radiation angle $\theta_2$ equal to or smaller than the first radiation angle $\theta_1$.

Next, preferred embodiments of the present invention will be described. In the following embodiments, the configurations of typical image exposure devices will be described. These embodiments are only intended to exemplify the image exposure devices and are not meant to limit the image exposure device described in the present specification.

First Embodiment

Figure 10:
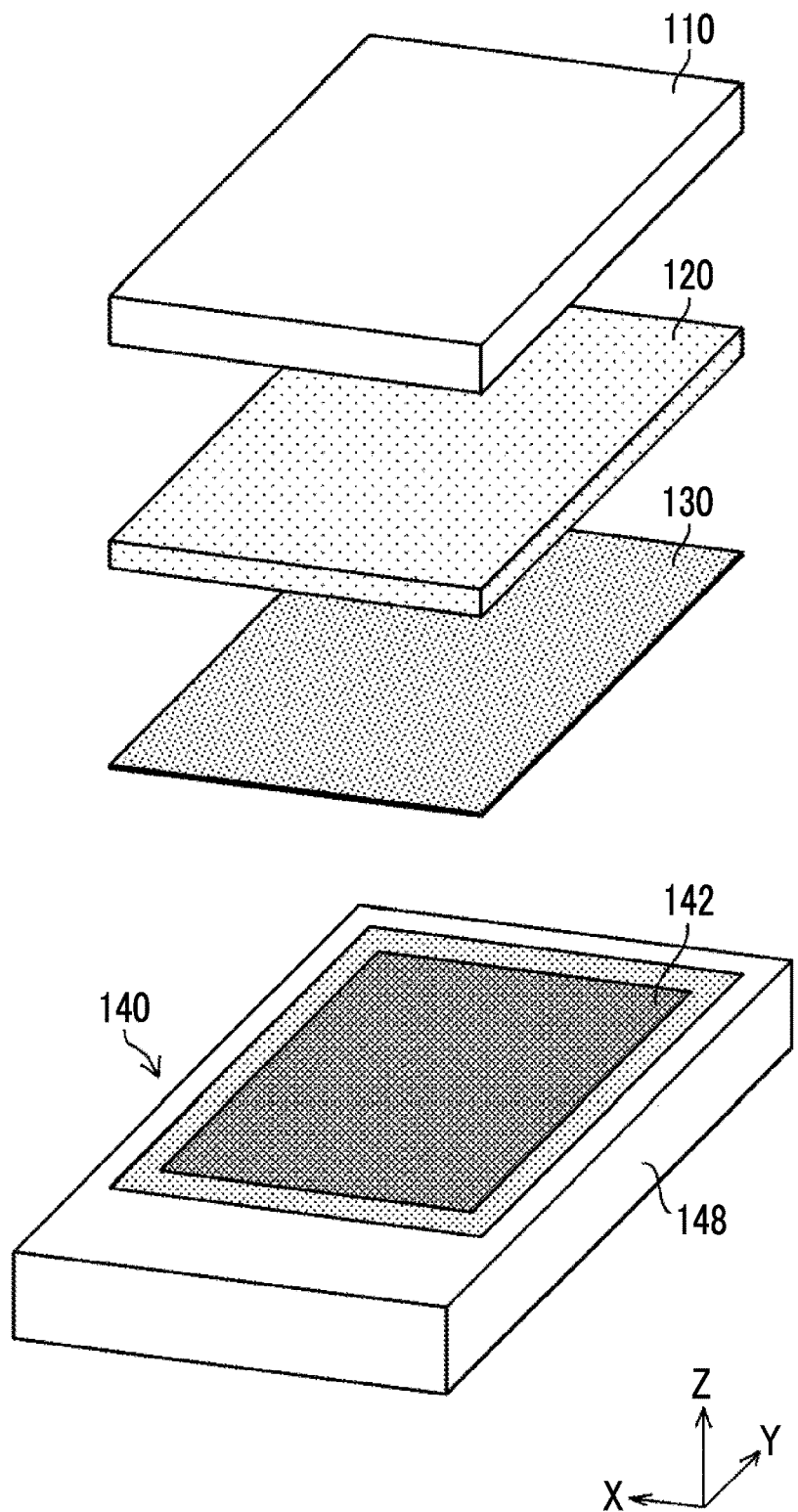
FIG. 10 is an exploded perspective view of an image exposure device of a first embodiment.
Figure 11:
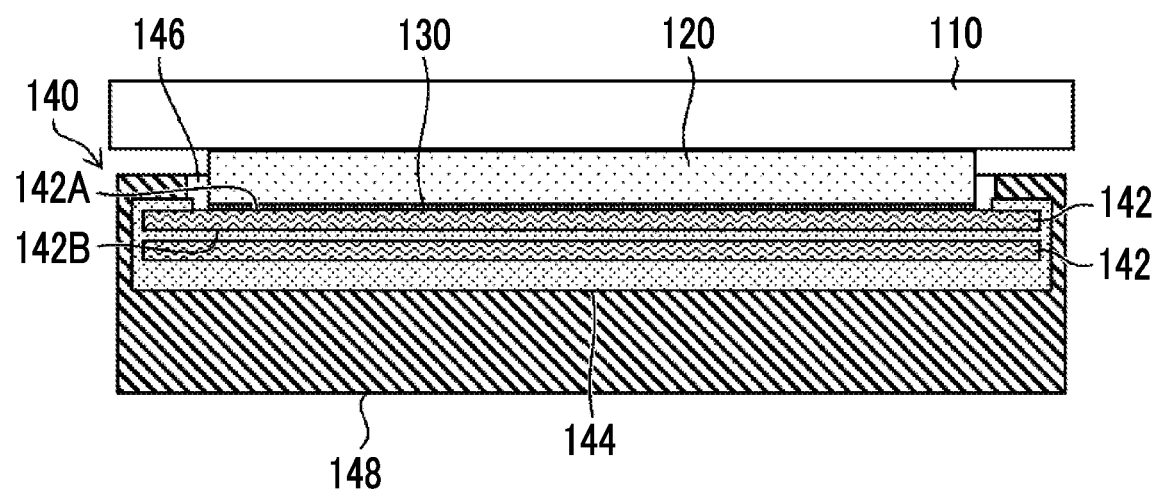
FIG. 11 is a cross-sectional view of the image exposure device of the first embodiment.

FIG. 10 is an exploded perspective view of an image exposure device 100 according to a first embodiment, and FIG. 11 is a cross-sectional view of the image exposure device 100 according to the first embodiment.

As shown in FIGS. 10 and 11, the image exposure device 100 of the first embodiment includes an image display device 110. As shown in FIG. 10, the image display device 110 is two-dimensional. Being two-dimensional means a state in which the device extends in X-Y directions. In the first embodiment, the image display device 110 extends in the X-Y directions. In addition, a plurality of pixels (not shown) of the image display device 110 is also arrayed two-dimensionally.

As the two-dimensional image display device 110, for example, a portable terminal represented by a smartphone and a tablet PC is applicable. The image display method of the image display device 110 is not limited as long as the image display device is capable of displaying an image, and a structure such as an LCD method or an OLED method is applicable. A glass surface is preferably removed from the image display device.

In the case of the LCD method, the image display device 110 includes a plurality of pixels including, for example, a backlight unit that functions as a light source and a color filter for displaying an image. In order to protect a plurality of pixels, the image display device 110 preferably includes a chassis, a glass surface, and the like.

As shown in FIGS. 10 and 11, the image exposure device 100 includes a fiber optic plate 120 as the collimation portion. The fiber optic plate 120 totally reflects and transmits light incident on an optical fiber. The pitches between optical fibers of the fiber optic plate 120 are preferably equal to or less than the pixel pitches of the image display device 110. As the fiber optic plate 120, for example, a fiber optic plate J12221 (NA=0.43, light receiving angle ±25.5°) manufactured by Hamamatsu Photonics K.K. can be applied. Therefore, the first transmitted light can be restricted to a range of 25.5° or smaller.

In addition, a louver can be applied instead of the fiber optic plate 120. As the louver, a louver film 200-LCD 024 manufactured by Elecom Co., Ltd. can be applied. The 200-LCD024 has a viewing angle of 60°. In a case where the viewing angle is converted to the incident angle, the incident angle is 30°. Therefore, the first transmitted light can be restricted to a range of 30° or smaller.

The fiber optic plate 120 preferably covers the entire image display surface of the image display device 110.

As shown in FIGS. 10 and 11, the image exposure device 100 includes an dichroic filter 130. The dichroic filter 130 is disposed on the fiber optic plate 120 on an opposite side of the image display device 110. In the dichroic filter 130, the number and thickness of the high refractive index layer and the low refractive index layer can be designed by using the above-described TFCalc. The dichroic filter 130 is preferably, for example, 5 μm or more and 50 μm or less. For example, the dichroic filter 130 is preferably laminated on a surface of the fiber optic plate 120 on an opposite side of the image display device 110. The fiber optic plate 120 can be applied as a substrate that supports the high refractive index layer and the low refractive index layer.

As shown in FIGS. 10 and 11, the image exposure device 100 includes a film pack 140 configured with an instant film 142 configuring the photosensitive recording medium and a case 144 that accommodates the instant film 142. A chassis 148 that is the photosensitive recording medium support portion for supporting the film pack 140 is provided. The chassis 148 is capable of attachably and detachably supporting the film pack 140.

The case 144 is capable of accommodating a plurality of the instant films 142. As shown in FIG. 11, in the case 144 and the chassis 148, an opening portion 146 is formed on a side facing the image display device 110.

The instant film 142 has a rectangular card shape. The instant film 142 is configured with an exposure surface 142A on a rear surface side and an observation surface 142B on a front surface side. The exposure surface 142A is a surface on which an image is recorded by exposure using parallel light, and the observation surface 142B is a surface on which the recorded image is observed.

The exposure surface 142A of the instant film 142 has an exposure portion, a pod portion and a trap portion across the exposure portion (not shown). In the pod portion, a developing solution pod encapsulating a developing solution is accommodated. In the trap portion, an absorbent is accommodated.

The instant film 142 is developed by delivering the developing solution in the pod portion to the exposure portion after exposure. The developing solution in the pod portion is extracted from the pod portion and delivered to the exposure portion by passing the instant film 142 between a pair of rollers (not shown). The developing solution left over during the delivery process is trapped in the trap portion.

In the first embodiment, the image display device 110 has two-dimensionally arrayed pixels extending in the X-Y directions. A size and a shape of the image display surface of the image display device 110 are substantially the same as a size and shape of the two-dimensional exposure surface of the fiber optic plate 120, the dichroic filter 130, and the instant film 142. Therefore, it is possible to expose the entire two-dimensional regions of the exposure surfaces of the instant films 142 to an image radiated from the image display device 110 at the same time.

An image needing to be exposed is displayed on the image display device 110. The radiation light radiated from the pixels of the image display device 110 is transmitted through the fiber optic plate 120 to be the first transmitted light radiated within a range of the first radiation angle narrower than the radiation angle of the radiation light. The first transmitted light is transmitted through the dichroic filter 130 to be radiated within a range of the second radiation angle equal to or smaller than the range of the first radiation angle, and becomes, for example, the second transmitted light that is close to parallel light. This second transmitted light reaches the exposure surfaces 142A of the instant films 142 and can be used to expose the instant films 142 at the same time. The entire two-dimensional region of the exposure surface 142A may be exposed at the same time by, for example, arraying a plurality of image display devices having one-dimensionally arrayed pixels to form two-dimensionally arrayed pixels and exposing the exposure surface at the same time.

After exposure, a development process is carried out on the instant films 142. On the instant film 142, an image that is rarely blurred is formed. It is possible to easily understand from the above-described principle that the degradation of the image quality is suppressed.

A shutter mechanism can be provided to the image display device 110 by controlling the time of displaying an image on the image display device 110. In addition, it is also possible to provide a shutter mechanism between the image display device 110 and the instant film 142.

In a case where the image display device 110 is a portable terminal, the image display device 110 is preferably attachable to and detachable from the image exposure device 100. For example, a user of the image display device 110 acquires an image from the image display device 110. A user attaches the image display device 110 as the configuration of a part of the image exposure device 100. The instant films 142 are exposed using the image of the image display device 110. After exposure, the image display device 110 is detached from the image exposure device 100, and a new image can be acquired from the image display device 110.

Second Embodiment

A second embodiment will be described with reference to FIG. 12. A portion exhibiting the same action as in the above-described first embodiment will be given the same reference sign and not be described in detail, and facts different from other embodiments will be mainly described.

Figure 12:
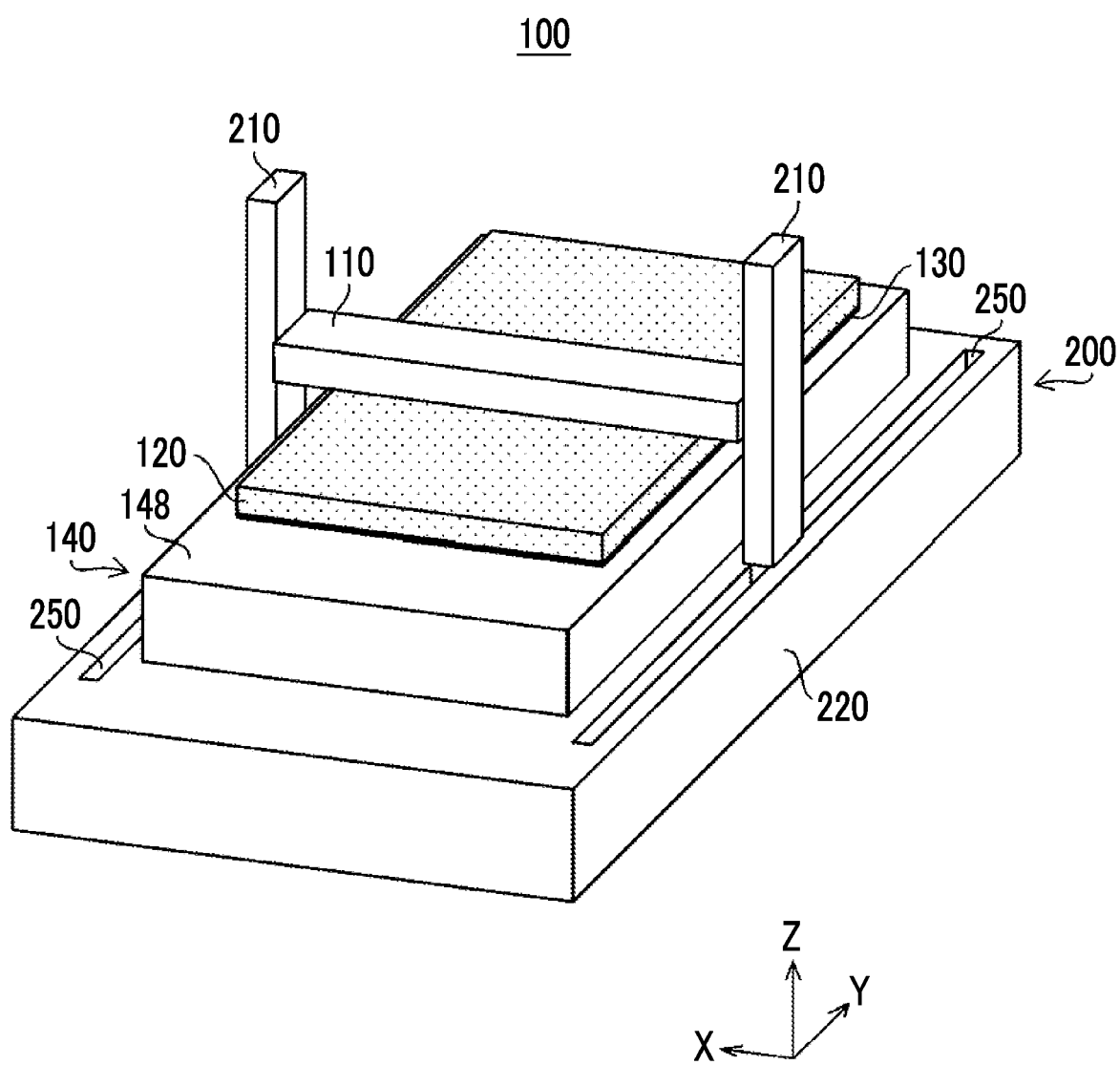
FIG. 12 is a perspective view of an image exposure device of a second embodiment.

As shown in FIG. 12, the image exposure device 100 includes the image display device 110, the fiber optic plate 120, the dichroic filter 130, and the film pack 140 formed by the case 144 accommodating a plurality of instant films (not shown).

Unlike the first embodiment, the image display device 110 of the second embodiment is one-dimensional. Being one-dimensional means a state in which the device extends in one direction of the X-Y directions. As shown in FIG. 12, the image display device 110 extends in the X direction. The image display device 110 has one-dimensionally arrayed pixels.

The image display device 110 is almost as long as a length of the X direction of the instant film. The image display device 110 is one-dimensional, and thus the length of the image display device 110 in the Y direction is shorter than the length of the instant film in the Y direction. The image display device 110 is smaller than the exposure surface of the instant film.

In the second embodiment, the instant films are exposed, and thus the image display device 110 is scanned in the Y direction that is a direction perpendicular to the X direction that is the array direction of the pixels.

As shown in FIG. 12, the image exposure device 100 includes a scanning portion 200 for scanning the image display device 110. The scanning portion 200 includes support portions 210 that support both ends of the image display device 110, a support table 220 that supports the film pack 140, and a driving portion (not shown) that is accommodated in the support table 220. The support table 220 includes rails 250, and the driving portion is capable of scanning the support portion 210 in the Y direction along the rails 250.

While the scanning portion 200 scans the image display device 110 in the vertical direction, the image display device 110 is capable of sequentially exposing the instant films. A control portion, not shown, is preferably provided in order to synchronize the image displaying of the image display device 110 and the driving of the scanning portion 200.

The radiation light radiated from the pixels of the image display device 110 is transmitted through the fiber optic plate 120 and the dichroic filter 130, and becomes the second transmitted light close to parallel light. This second transmitted light reaches the exposure surfaces 142A of the instant films 142 and can be used to sequentially expose the instant films 142.

After exposure, a development process is carried out on the instant films 142. On the instant film 142, an image that is rarely blurred is formed. It is possible to easily understand from the above-described principle that the degradation of the image quality is suppressed.

Figure 13:
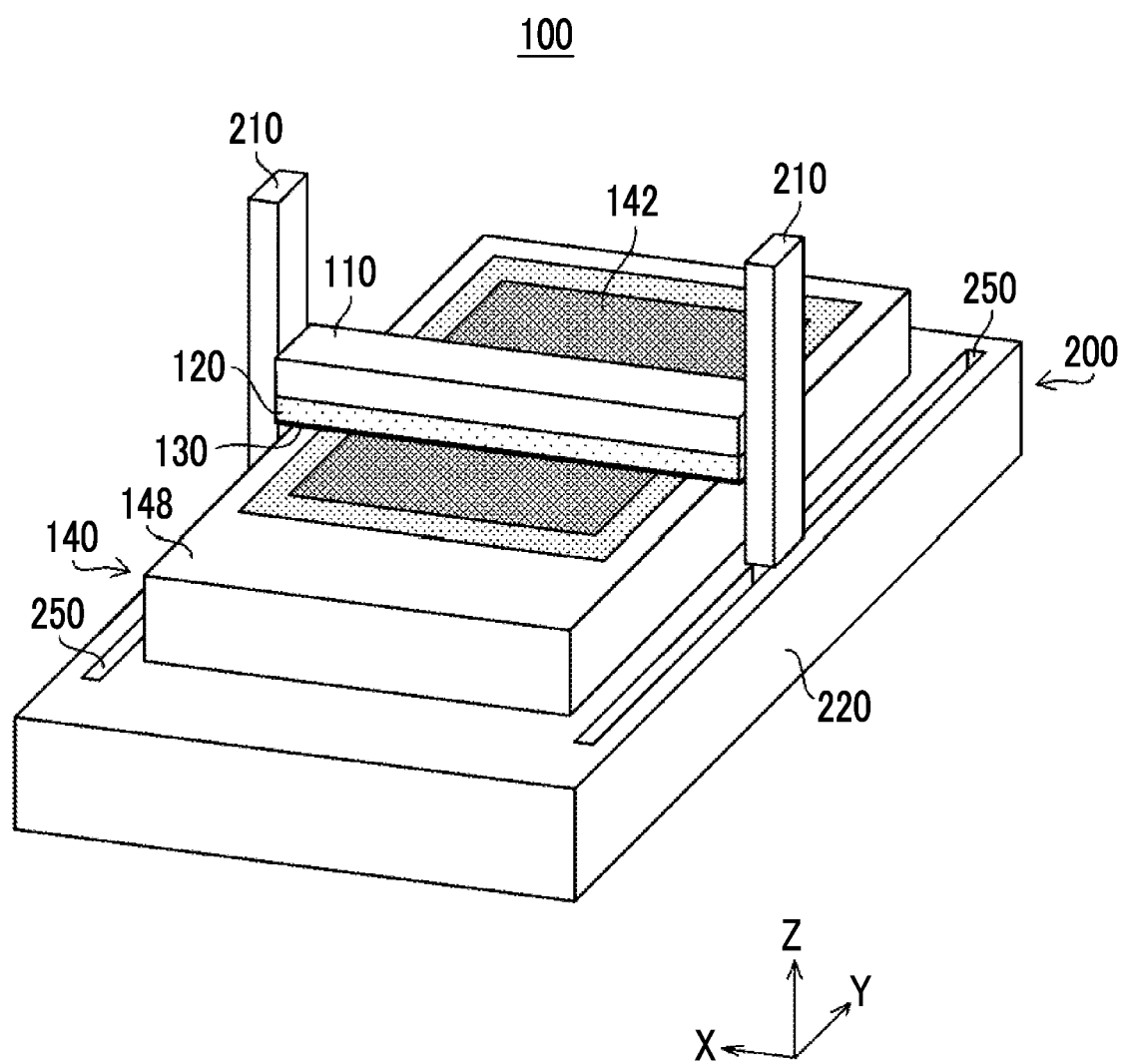
FIG. 13 is a perspective view of a modification example of the image exposure device of the second embodiment.

FIG. 13 shows a modification example of the image exposure device 100 of the second embodiment. The modification example of the image exposure device 100 includes the image display device 110, the fiber optic plate 120, the dichroic filter 130, and the chassis 148 that attachably and detachably supports the film pack 140 formed by the case 144 accommodating the instant films 142.

In the modification example of the image exposure device 100, the fiber optic plate 120 and the dichroic filter 130 are configured one-dimensionally so as to extend in the X direction that is the same as the array direction of the pixels of the image display device 110.

The scanning portion 200 scans the image display device 110, the fiber optic plate 120, and the dichroic filter 130 along a direction perpendicular to the array direction of the pixels of the image display device 110. The image display device 110 can sequentially expose the instant films 142 while scanning.

Similarly to the first embodiment, the radiation light radiated from the pixels of the image display device 110 is transmitted through the fiber optic plate 120 and the dichroic filter 130, and becomes the second transmitted light close to parallel light. This second transmitted light reaches the exposure surfaces 142A of the instant films 142 and can be used to sequentially expose the instant films 142.

After exposure, a development process is carried out on the instant films 142. On the instant film 142, an image that is rarely blurred is formed. It is possible to easily understand from the above-described principle that the degradation of the image quality is suppressed.

The case of exposing the instant films while scanning the image display device 110 has been described, but the instant films may be exposed while scanning the instant films as long as the image display device 110 and the instant films 142 can be scanned relative to each other. That is, at least one of the image display device 110 or the instant films 142 needs to be scanned.

Third Embodiment

A third embodiment will be described with reference to FIG. 14. A portion exhibiting the same action as in the above-described first embodiment and second embodiment will be given the same reference sign and not be described in detail, and facts different from other embodiments will be mainly described.

Figure 14:
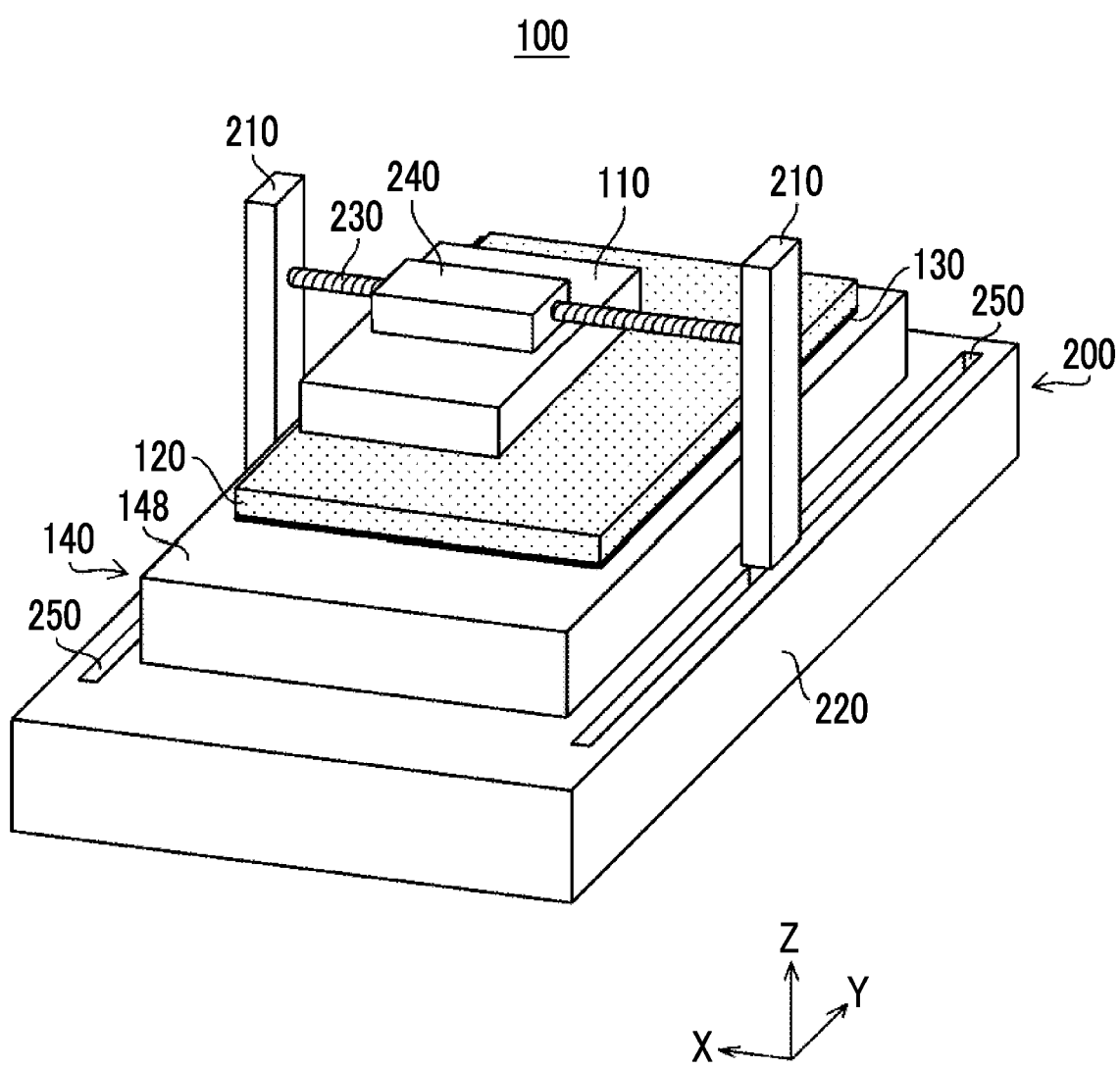
FIG. 14 is a perspective view of an image exposure device of a third embodiment.

As shown in FIG. 14, the image exposure device 100 includes the image display device 110, the fiber optic plate 120, the dichroic filter 130, the chassis 148 that attachably and detachably supports the film pack 140 formed by the case 144 accommodating a plurality of instant films (not shown), and the scanning portion 200.

Unlike the second embodiment, the image display device 110 of the third embodiment is two-dimensional. In addition, the image display device 110 has two-dimensionally arrayed pixels on a region having a smaller area than the exposure surface of instant film that is the photosensitive recording medium. The plurality of pixels is preferably two-dimensionally arrayed, for example, in a matrix shape.

In order to expose the instant films, like the second embodiment, the third embodiment includes the scanning portion 200. On the other hand, unlike the second embodiment, the scanning portion 200 of the third embodiment is capable of scanning the image display device 110 not only in the Y direction but also in the X direction.

For example, in pixels that are two-dimensionally arrayed in a matrix shape, in a case where the row direction is regarded as the X direction, the scanning portion is preferably scanned along both directions of the row direction (X direction) and a direction perpendicular to the row direction (X direction) (Y direction).

Therefore, the scanning portion 200 includes a ball screw 230 and a movement portion 240 including a nut that is engaged with the ball screw 230. The movement portion 240 is capable of moving in the X direction by the rotary motion of the ball screw 230. The movement portion 240 preferably has a holding portion (not shown) for holding the image display device 110.

While the scanning portion 200 scans the image display device 110 in the X direction and the Y direction, the image display device 110 is capable of sequentially exposing the instant films. A control portion, not shown, is preferably provided in order to synchronize the image displaying of the image display device 110 and the driving of the scanning portion 200.

The third embodiment is effectively applicable in the case of exposing a photosensitive recording medium having an exposure surface that is larger than the image display device 110.

Similarly to the first embodiment, the radiation light radiated from the pixels of the image display device 110 is transmitted through the fiber optic plate 120 and the dichroic filter 130, and becomes the second transmitted light close to parallel light. This second transmitted light reaches the exposure surfaces 142A of the instant films 142 and can be used to sequentially expose the instant films 142.

After exposure, a development process is carried out on the instant films 142. On the instant film 142, an image that is rarely blurred is formed. It is possible to easily understand from the above-described principle that the degradation of the image quality is suppressed.

Figure 15:
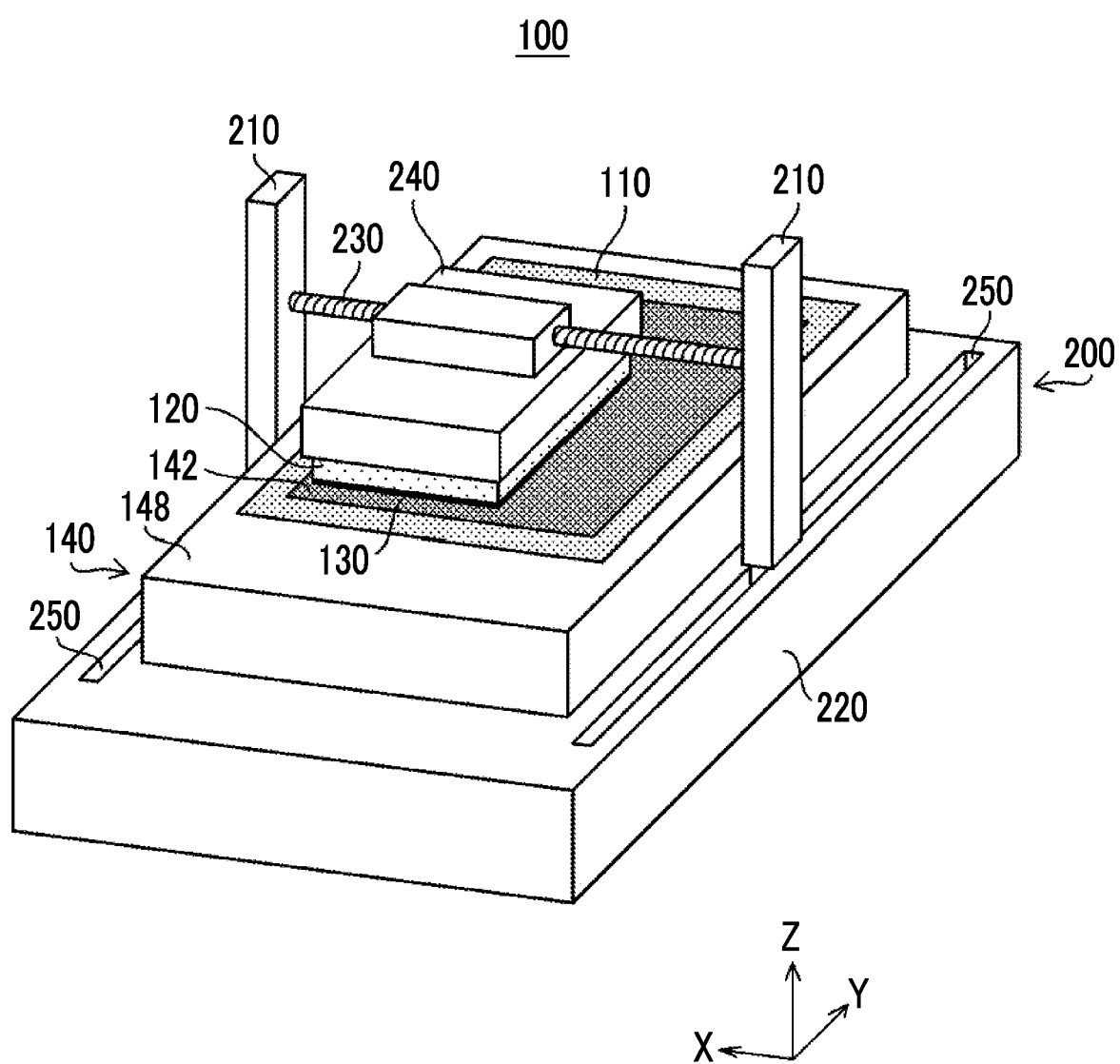
FIG. 15 is a perspective view of a modification example of the image exposure device of the third embodiment.

FIG. 15 shows a modification example of the image exposure device 100 of the third embodiment. The modification example of the image exposure device 100 includes the image display device 110, the fiber optic plate 120, the dichroic filter 130, the chassis 148 that attachably and detachably supports the film pack 140 formed by the case 144 accommodating the instant films 142, and scanning portion 200.

In the modification example of the image exposure device 100, the fiber optic plate 120, and the dichroic filter 130 are, similar to the image display device 110, two-dimensional and smaller than the instant film 142 that is the photosensitive recording medium.

While the scanning portion 200 scans the image display device 110, the fiber optic plate 120, and the dichroic filter 130 in the X direction and the Y direction, the image display device 110 is capable of sequentially exposing the instant films 142. A control portion, not shown, is preferably provided in order to synchronize the image displaying of the image display device 110 and the driving of the scanning portion 200.

The radiation light radiated from the pixels of the image display device 110 is transmitted through the fiber optic plate 120 and the dichroic filter 130, and becomes the second transmitted light close to parallel light. This second transmitted light reaches the exposure surfaces 142A of the instant films 142 and can be used to sequentially expose the instant films 142.

After exposure, a development process is carried out on the instant films 142. On the instant film 142, an image that is rarely blurred is formed. It is possible to easily understand from the above-described principle that the degradation of the image quality is suppressed.

The case of exposing the instant films while scanning the image display device 110 in the X direction and the Y direction has been described, but the instant films may be exposed while scanning the instant films in the X direction and the Y direction as long as the image display device 110 and the instant films 142 can be relatively scanned. That is, at least one of the image display device 110 or the instant films 142 needs to be scanned in both directions of the X direction and the Y direction.

In the second embodiment and the third embodiment, the image display device is smaller than the photosensitive recording medium. In exposure ranges to the radiation light radiated from the pixels of the image display device, adjacent exposure ranges may partially overlap each other. In the case of preventing the partial overlapping of the exposure ranges, there is a concern that a non-exposure region may be generated on the photosensitive recording medium. A state in which no image is formed on the photosensitive recording medium which is attributed to the non-exposure region is preferably avoided.

EXPLANATION OF REFERENCES

10: image exposure device
20: image display device
21: pixel
23: image display surface
40: photosensitive recording medium
41: exposure surface
50: collimation portion
60: dichroic filter
70: photosensitive recording medium support portion
100: image exposure device
110: image display device
120: fiber optic plate
130: dichroic filter
140: film pack
142: instant film
142A: exposure surface
142B: observation surface
144: case
146: opening portion
148: chassis
200: scanning portion
210: support portion
220: support table
230: ball screw
240: movement portion
250: rail
RL: radiation light
$TL_1$: first transmitted light
$TL_2$: second transmitted light
$\theta_1$: first radiation angle
$\theta_2$: second radiation angle

What is claimed is:

1. An image exposure device comprising:
an image display device having pixels that emit light having a plurality of wavelengths;
a photosensitive recording medium support portion that supports a photosensitive recording medium for recording an image of the image display device in a state in which an exposure surface of the photosensitive recording medium faces the image display device;
a collimation portion that is disposed between the image display device and the photosensitive recording medium support portion and makes radiation light including the light having a plurality of wavelengths radiated from the pixels into first transmitted light radiated within a range of a first radiation angle narrower than a radiation angle of the radiation light; and
a dichroic filter that is disposed between the collimation portion and the photosensitive recording medium support portion, and makes the first transmitted light including the light having a plurality of wavelengths into second transmitted light radiated within a range of a second radiation angle equal to or smaller than the first radiation angle.

2. The image exposure device according to claim 1, wherein the dichroic filter is formed by a multilayer film in which a plurality of high refractive index layers having a refractive index of $n_1$ and a plurality of low refractive index layers having a refractive index of $n_2$ are alternately laminated, an optical film thickness of the high refractive index layer is an integral multiple of $\lambda/4$, and an optical film thickness of the low refractive index layer is an integral multiple of $\lambda/4$.

3. The image exposure device according to claim 2, wherein the multilayer film includes two or more layers of any of a thick high refractive index layer having an optical film thickness at least 4 times as large as $\lambda/4$ or a thick low refractive index layer having an optical film thickness at least 4 times as large as $\lambda/4$.

4. The image exposure device according to claim 3, wherein two layers of either the thick high refractive index layer or the thick low refractive index layer have different ratios of the optical film thickness with respect to $\lambda/4$.

5. The image exposure device according to claim 4, wherein the collimation portion includes at least one selected from a louver, a fiber optic plate, or a capillary plate.

6. The image exposure device according to claim 4, wherein the image display device has two-dimensionally arrayed pixels, and
the image exposure device exposes an entire two-dimensional region of the exposure surface of the photosensitive recording medium at the same time.

7. The image exposure device according to claim 3, wherein the collimation portion includes at least one selected from a louver, a fiber optic plate, or a capillary plate.

8. The image exposure device according to claim 3, wherein the image display device has two-dimensionally arrayed pixels, and
the image exposure device exposes an entire two-dimensional region of the exposure surface of the photosensitive recording medium at the same time.

9. The image exposure device according to claim 2, wherein the collimation portion includes at least one selected from a louver, a fiber optic plate, or a capillary plate.

10. The image exposure device according to claim 2, wherein the image display device has two-dimensionally arrayed pixels, and the image exposure device exposes an entire two-dimensional region of the exposure surface of the photosensitive recording medium at the same time.

11. The image exposure device according to claim 1, wherein the collimation portion includes at least one selected from a louver, a fiber optic plate, or a capillary plate.

12. The image exposure device according to claim 11, wherein the collimation portion includes at least one selected from a louver, a fiber optic plate, or a capillary plate.

13. The image exposure device according to claim 11, wherein the image display device has two-dimensionally arrayed pixels, and
the image exposure device exposes an entire two-dimensional region of the exposure surface of the photosensitive recording medium at the same time.

14. The image exposure device according to claim 1, wherein the image display device has two-dimensionally arrayed pixels, and
the image exposure device exposes an entire two-dimensional region of the exposure surface of the photosensitive recording medium at the same time.

15. The image exposure device according to claim 1, wherein the image display device has one-dimensionally arrayed pixels, and
the image exposure device further comprises a scanning portion that scans at least any one of the image display device or the photosensitive recording medium supported by the photosensitive recording medium support portion, along a direction perpendicular to an array direction of the pixels of the image display device.

16. The image exposure device according to claim 15, wherein, among exposure ranges to light radiated from the pixels, adjacent exposure ranges partially overlap each other.

17. The image exposure device according to claim 1, wherein the image display device has two-dimensionally arrayed pixels on a region having a smaller area than the exposure surface of the photosensitive recording medium, and
the image exposure device further comprises a scanning portion that scans at least any one of the image display device or the photosensitive recording medium supported by the photosensitive recording medium support portion along both an array direction of the pixels of the image display device and a direction perpendicular to the array direction of the pixels.

18. The image exposure device according to claim 1, wherein the image display device is attachable and detachable.

19. The image exposure device according to claim 1, wherein the photosensitive recording medium support portion supports the photosensitive recording medium attachably and detachably.

20. An image exposure method comprising:
a step of preparing an image display device having pixels that emit light having a plurality of wavelengths;
a step of preparing a photosensitive recording medium support portion that supports a photosensitive recording medium for recording an image of the image display device in a state in which an exposure surface of the photosensitive recording medium faces the image display device; and
a step of exposing the exposure surface of the photosensitive recording medium to second transmitted light, through a collimation portion that is disposed between the image display device and the photosensitive recording medium support portion and makes radiation light including the light having a plurality of wavelengths radiated from the pixels into first transmitted light radiated within a range of a first radiation angle narrower than a radiation angle of the radiation light, and a dichroic filter that is disposed between the collimation portion and the photosensitive recording medium support portion and makes the first transmitted light including the light having a plurality of wavelengths into the second transmitted light radiated within a range of a second radiation angle equal to or smaller than the first radiation angle.

* * * * *